United States Patent

Tanaka et al.

[11] Patent Number: 5,886,136
[45] Date of Patent: Mar. 23, 1999

[54] PATTERN FORMING PROCESS

[75] Inventors: Akira Tanaka; Masami Koshiyama; Kei Sakamoto; Yasuhiro Yoneda; Kishio Yokouchi; Daisuke Mizutani; Yoshikatsu Ishizuki, all of Kawasaki, Japan

[73] Assignees: Nippon Zeon Co., Ltd., Tokyo; Fujitsu Limited, Kanagawa, both of Japan

[21] Appl. No.: 819,111

[22] Filed: Mar. 17, 1997

Related U.S. Application Data

[63] Continuation-in-part of Ser. No. 527,057, Sep. 12, 1995, Pat. No. 5,777,068.

[30] Foreign Application Priority Data

Mar. 19, 1996 [JP] Japan ................................ 8-090244

[51] Int. Cl.$^6$ ............................. C08G 73/00; G03F 7/037
[52] U.S. Cl. ........................ 528/353; 528/170; 430/170; 430/175; 430/270; 430/281; 430/283.1; 430/286; 430/289; 430/297; 430/299
[58] Field of Search ..................... 528/353, 170; 430/286, 170, 175, 281, 283.1, 289, 297, 299

[56] References Cited

U.S. PATENT DOCUMENTS

| Re. 030,186 | 1/1980 | Rubner et al. | 96/35.1 |
|---|---|---|---|
| 3,957,512 | 5/1976 | Kleeberg et al. | 430/281 |
| 4,040,831 | 8/1977 | Rubner et al. | 96/35.1 |
| 4,243,743 | 1/1981 | Hiramoto et al. | 430/281 |
| 5,238,784 | 8/1993 | Tokoh et al. | 430/283 |
| 5,348,835 | 9/1994 | Opa et al. | 430/165 |
| 5,518,864 | 5/1996 | Opa et al. | 430/165 |

FOREIGN PATENT DOCUMENTS

| 0502400 | 9/1992 | European Pat. Off. . |
|---|---|---|
| 0702270 A2 | 3/1996 | European Pat. Off. . |
| 5530207 | 11/1974 | Japan . |
| 5541422 | 4/1976 | Japan . |
| 5952822 | 11/1979 | Japan . |
| 63-183439 | 7/1988 | Japan . |
| 1259351 | 10/1989 | Japan . |
| 0470661 | 3/1992 | Japan . |
| 4363361 | 12/1992 | Japan . |
| 0055995 | 1/1993 | Japan . |
| 5100424 | 4/1993 | Japan . |
| 5281717 | 10/1993 | Japan . |
| 8082931 | 3/1996 | Japan . |
| 8095247 | 4/1996 | Japan . |

OTHER PUBLICATIONS

Kubota et al. *J. Macromol. Sci. –Chem.* A24(12). pp. 1407–1422 (1987).

*Primary Examiner*—P. Hampton Hightower
*Attorney, Agent, or Firm*—Dinsmore & Shohl LLP

[57] ABSTRACT

Disclosed herein is a pattern forming process comprising the steps of coating a substrate with a photosensitive resin composition comprising a polyamic compound having, at each terminal thereof, an actinic ray-sensitive functional group which has substituent groups each having a photopolymerizable carbon-carbon double bond, a photosensitive auxiliary having a photopolymerizable functional group, a photopolymerization initiator, and a solvent to form a film; subjecting the film to patterning exposure; and then developing the thus-exposed film with an alkaline developer or alkaline aqueous solution.

28 Claims, No Drawings

PATTERN FORMING PROCESS

RELATED APPLICATION

The present application is a continuation-in-part of application Ser. No.08/527,057 filed Sep. 12, 1995, now U.S. Pat. No. 5,777,068.

FIELD OF THE INVENTION

The present invention relates to a pattern forming process making use of a photosensitive polyimide resin composition, and more particularly to a pattern forming process comprising a step of developing with an alkaline developer or alkaline aqueous solution.

BACKGROUND OF THE INVENTION

In a fabrication process of a semiconductor device, a photoresist is separated and removed from a substrate after its role has been filled in a step of etching or the like. However, such a photoresist film remains unremoved as a permanent film if it is used as a surface-protecting film or a layer insulation film. Therefore, it is required to have electrically and mechanically high characteristics or properties. Further, such a film also must resist a high temperature applied in the fabrication process of the semiconductor device.

In recent years, a film formed of a photosensitive polyimide resin has been used in such an application. The polyimide resin is excellent in electrical and mechanical characteristics, and heat resistance and is used as a surface-protecting film or layer insulation film for a semiconductor device, or the like. In order to selectively provide a film of a polyimide resin on minute parts of the semiconductor device, it is convenient to use a photosensitive polyimide resin.

As a process for selectively providing the polyimide resin film on the minute parts, there has heretofore been known a process in which a polyimide resin is coated on the whole surface of a semiconductor device to form a film, a pattern is formed on the film by means of a photoresist, and the polyimide resin film is etched with hydrazine or the like. However, this process is complicated in process and requires to use an etchant high in toxicity.

On the other hand, various proposals as to photosensitive polyimide resins the solubility of which varies upon exposure to light have been made in recent years. Typical examples of such a photosensitive polyimide resin include compounds with a photopolymerizable acryloyl group introduced into a polyamic acid (hereinafter may called polyamide acid) which is a precursor of a polyimide resin (Japanese Patent Publication Nos. 30207/1980 and 41422/1980, etc.). A precursor of polyimide, in which an acryloyl group has been introduced in the form of a salt, has also be proposed (Japanese Patent Publication No. 52822/1984).

In the photosensitive polyimide resin making use of such a polyimide precursor, a film of the photosensitive polyimide resin is formed on a semiconductor device, a pattern is formed by irradiation of light, and the polyimide resin is cyclized by a heat treatment, thereby completing polyimidation. At this time, the moiety of the photosensitive group is eliminated and volatilized, thereby reducing the final thickness of the film formed.

The use of the photosensitive polyimide resin permits marked shortening of a pattern-forming process. However, the conventional photosensitive polyimide resins have involved drawbacks such as the synthesizing route is complicated, the photosensitive group is not fully eliminated by polyimidation, or they are insufficient in storage stability and sensitivity to light.

There have recently been proposed photosensitive resin compositions comprising an actinic ray-sensitive functional group (Japanese Patent Application Laid-Open Nos. 70661/1992 and 77741/1992). These photosensitive resin compositions have been prepared by a special process in which a polyamic acid having carbon-carbon double bonds at its terminals is reacted in a solvent composed of an amide compound having a polymerizable carbon-carbon double bond, and are characterized in that the polyamic acid itself is photosensitive and the solvent itself is 100% photosensitive. However, the polyamic compounds disclosed in these publications are easy to eliminate their modified terminal groups and poor in stability. This polyamic compound is generally obtained by modifying a part of the acid anhydride with the actinic ray-sensitive functional group to form an ester and then adding a diamine to form a polymer. However, this process can form only a polyamic acid wide in scattering of molecular weight and hence encounters difficulties in synthesizing only a polyamic acid high in molecular weight. In the photosensitive resin compositions described in these publications, the solvent also functions as a photosensitive auxiliary. Therefore, such a composition has involved a problem that when the composition is applied to a substrate and subjected to a heat treatment to form a film, a residual stress of the film against the substrate increases to a great extent.

On the other hand, the photosensitive polyimide resin compositions have involved a problem that they are difficult to develop with an alkaline developer or alkaline aqueous solution. For example, the negative type photosensitive polyimide resins disclosed in Japanese Patent Publication Nos. 30207/1980 and 41422/1980, etc., and those obtained by introducing a photopolymerizable group through an ionic bond into a precursor of polyimide disclosed in Japanese Patent Publication No. 52822/1984 and the like all use organic solvents as their developers. Therefore, such photosensitive polyimide resins have involved such problems that developer cost is high, explosion-proof apparatus are required, and human health may be endangered.

As alkali-developed or alkaline aqueous solution-developed photosensitive resins, there have hitherto been reported, for example, those obtained by introducing a protective group capable of leaving into a carboxyl group or a phenolic hydroxyl group under acid or alkaline conditions [J. Macromol. Sci. Chem., A24, 10, 1407 (1987), Japanese Patent Application Laid-Open No. 259351/1989 and Japanese Patent Application Laid-Open No. 363361/1992]. However, these resins require to introduce a substituent group great in steric hindrance through a covalent bond into a main-chain carboxyl group or side-chain hydroxyl group. Therefore, they involve such problems that their synthetic processes become complicated, they require a high curing temperature, and film properties of films formed therefrom are deteriorated.

It has been proposed to incorporate a dihydropyridine derivative, which is a photo-induced base generator, and accelerate the imidation-facilitating effect of a base formed by exposure by a PEB (post-exposure baking) treatment, thereby developing a difference in solubility caused by the imidation with an alkaline developer (Japanese Patent Application Laid-Open Nos. 5995/1993 and 281717/1993). However, these processes involves such problems that the PEB treatment must be used, and the film formed has a low sensitivity to exposure, and so an exposure value must be made greater.

It has also been proposed to use an alkaline developer or alkaline aqueous solution as a developer for photosensitive resin compositions added with a photopolymerizable monomer as a crosslinking auxiliary (Japanese Patent Application Laid-Open Nos. 183439/1988 and 100424/1993). In these processes, special crosslinking monomers such as those having an isocyanate structure or a urethane structure are added as the photopolymerizable monomers. Since the base polymers have no photopolymerizable group in their structures, there is a problem that sensitivity and resolution are insufficient.

OBJECTS AND SUMMARY OF THE INVENTION

It is an object of the present invention to develop a photosensitive polyimide resin composition capable of developing with an alkaline developer or alkaline aqueous solution, thereby providing a pattern forming process by which excellent film properties and work environment safe and gentle to nature and human can be satisfied at the same time.

In the course of advancing the research and development of photosensitive polyimide resin compositions, the present inventors found that photosensitive polyimide resin compositions which are excellent in resist properties such as sensitivity and have high storage stability can be obtained by using a polyamic compound having a structure that the terminals of a polyamic acid have been modified with an aminobenzene derivative or trimellitic acid derivative which has substituent groups having a photopolymerizable carbon-carbon double bond in its molecule (Japanese Patent Application Laid-Open Nos. 82931/1996 and 95247/1996). Since these polyamic compounds have a structure that the terminals of a polyamic acid have been modified with the aminobenzene derivative or trimellitic acid derivative having the specific structure, there can be provided photosensitive polyimide resin compositions which are excellent in storage stability, can be composed of only a polymer having a high molecular weight and permits the formation of a film high in sensitivity and small in residual stress.

The present inventors have carried out a further investigation as to the properties of the photosensitive resin compositions making use of such a terminal-modified polyamic compound. As a result, it has been found that the photosensitive resin compositions can be developed with an alkaline developer or alkaline aqueous solution.

Since the polyamic compounds have photosensitive groups only at their terminals, the crosslinking density thereof is generally supplied by adding a crosslinking auxiliary (photocrosslinkable monomer; photosensitive auxiliary). After exposure, the crosslinking auxiliary is photo-polymerized with the terminal crosslinkable groups introduced into a main-chain skeleton at the exposed part, thereby reducing their solubility in developers (organic solvents). Therefore, a pattern corresponding to an unexposed part can be formed. On the other hand, since the carboxyl groups in the main-skeleton of such a terminal-modified polyamic compound are not restricted, the polyamic compound is soluble in alkaline developers and alkaline aqueous solutions. Therefore, suitable solubility in the alkaline developers and alkaline aqueous solutions can be imparted to the photosensitive resin compositions by optimizing the combination of the structure and molecular weight of the polyamic compound.

The terminal-modified polyamic acids used in the present invention are easy to synthesize and high in degree of freedom of selection of the acid anhydride and diamine for the main-chain skeleton. In addition, the molecular weight of such a polyamic compound can be easily controlled by changing the rate of modification at terminals. When a photosensitive resin composition containing this terminal-modified polyamic compound is used to form a film on a substrate, and the film is exposed, the crosslinking auxiliary and the modified parts at the terminals undergo polymerization, thereby reducing the solubility of the exposed part due to increase of molecular weight. The polymerization of the crosslinking auxiliary prevents the penetration of a developer, so that a difference in solubility arises between the exposed and unexposed portions, thereby permitting the formation of a pattern.

According to the photosensitive resin composition according to the present invention, an alkaline developer or alkaline aqueous solution can be used as a developer. The fact that particularly, the alkaline aqueous solution can be used as a developer has many advantages such as reduction in development costs (developer cost and waste treatment cost), to make explosion-proof apparatus unnecessary and high safety for human body. Besides, a rinsing liquid can be made aqueous, so that advantages from the viewpoint of cost and safety for apparatus and human body are increased. The inhibition of a reaction between the carboxyl groups in the main-chain structure and copper wiring (inhibition of copper migration) can be achieved by incorporating a tetrazole into the photosensitive resin composition.

The present invention has been led to completion on the basis of these findings.

According to the present invention, there is thus provided a pattern forming process, comprising the steps of:
 coating a substrate with a photosensitive resin composition comprising:
  (A) a polyamic compound having, at each terminal thereof, at least one actinic ray-sensitive functional group selected from the group consisting of a group $Z^1$ represented by the following formula (1) and a group $Z^2$ represented by the following formula (2):

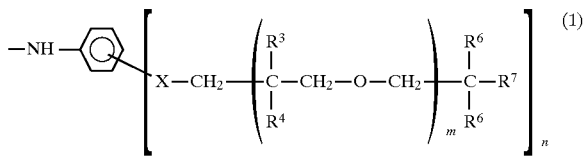

wherein X is a single bond, —O—, —CO—, —COO—, —OCO—, —OCOO—, —COCH$_2$O—, —S—, —SO—, —SO$_2$— or —SO$_2$O—, $R^3$, $R^4$, $R^5$, $R^6$ and $R^7$ are, independently of one another, a substituent group having a photopolymerizable carbon-carbon double bond, m is 0 or 1, and n is an integer of 1–3;

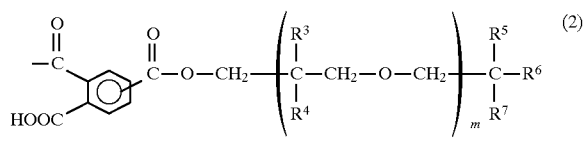

wherein $R^3$, $R^4$, $R^5$, $R^6$ and $R^7$ are, independently of one another, a substituent group having a photopolymerizable carbon-carbon double bond, and m is 0 or 1;
  (B) a photosensitive auxiliary having a photopolymerizable functional group;
  (C) a photopolymerization initiator; and
  (D) a solvent, to form a film;
subjecting the film to patterning exposure; and then developing the thus-exposed film with an alkaline developer or alkaline aqueous solution.

A preferable example of the polyamic compound (A) may include a polyamic compound (A1) which has, at each terminal thereof, the actinic ray-sensitive functional group $Z^1$ represented by the formula (1) and is represented by the following formula (3):

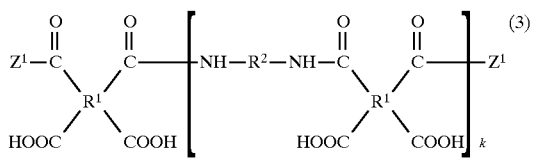

wherein $R^1$ is a tetravalent organic group, $R^2$ is a bivalent organic group, k is an integer of 5–10,000, and $Z^1$ is the actinic ray-sensitive functional group represented by the formula (1).

Another preferable example of the polyamic compound (A) may include a polyamic compound (A2) which has, at each terminal thereof, the actinic ray-sensitive functional group $Z^2$ represented by the formula (2) and is represented by the following formula (4):

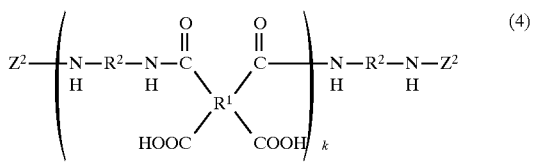

wherein $R^1$ is a tetravalent organic group, $R^2$ is a bivalent organic group, k is an integer of 5–10,000, and $Z^2$ is the actinic ray-sensitive functional group represented by the formula (2).

DETAILED DESCRIPTION OF THE INVENTION (A) Polyamic compound

The polyamic compound (A1) useful in the practice of the present invention is generally obtained by adding a tetra-carboxylic acid or the acid anhydride thereof to a mixture of a diamine compound and an aminobenzene derivative such as tris(methacryloyl)pentaerythritol p-aminobenzoate and subjecting these components to a condensation reaction in accordance with a method known per se in the art. According to this process, a polymer having a high molecular weight can be stably obtained.

On the other hand, the polyamic compound (A2) useful in the practice of the present invention is generally obtained by adding a trimellitic acid derivative such as tris (methacryloyl)pentaerythritol anhydrotrimellitate and a tet-racarboxylic acid or the acid anhydride thereof to a diamine compound and subjecting these components to a condensation reaction in accordance with a method known per se in the art. The polyamic compound (A2) is also obtained by adding a tetracarboxylic acid or the acid anhydride thereof to a mixture of a diamine compound and a trimellitic acid derivative and subjecting these components to a condensation reaction in accordance with a method known per se in the art. According to these processes, polymers having a high molecular weight can be stably obtained.

<Diamine compound>

Examples of the diamine compound used in the present invention include aromatic diamines such as 2,2'-di(p-aminophenyl)-6,6'-bibenzoxazole, 2,2'-di(p-aminophenyl)-6,6'-bibenzoxazole, 2,2'-di(p-aminophenyl)-5,5'-bibenzoxazole, m-phenylenediamine, 1-isopropyl-2,4-phenylenediamine, p-phenylenediamine, 4,4'-diamino-diphenylpropane, 3,3'-diaminodiphenylpropane, 4,4'-diaminodiphenylethane, 3,3'-diaminodiphenylethane, 4,4'-diaminodiphenylmethane, 3,3'-diaminodiphenylmethane, 4,4'-diaminodiphenyl sulfide, 3,3'-diaminodiphenyl sulfide, 4,4'-diaminodiphenyl sulfone, 3,3'-diaminodiphenyl sulfone, 4,4'-diaminodiphenyl ether, 3,3'-diaminodiphenyl ether, 1,4-bis(4-aminophenoxy)benzene, benzidine, 4,4"-diamino-p-terphenyl, 3,3"-diamino-p-terphenyl, bis(p-amino-cyclohexyl)methene, bis(p-β-amino-t-butylphenyl ether, bis(p-β-methyl-δ-aminopentyl)benzene, p-bis(2-methyl-4-aminopentyl)benzene, p-bis(1,1-dimethyl-5-aminopentyl)-benzene, 1,5-diaminonaphthalene, 2,6-diaminonaphthalene, 2,4-bis(β-amino-t-butyl)toluene, 2,4-diaminotoluene, m-xylene-2,5-diamine, p-xylene-2,5-diamine, m-xylylene-diamine and p-xylylenediamine; heterocyclic diamines such as 2,6-diaminopyridine, 2,5-diaminopyridine and 2,5-diamino-1,3,4-oxadiazole; alicyclic diamines such as 1,4-diaminocyclohexane; aliphatic diamines such as piperazine, methylenediamine, ethylenediamine, propylenediamine, 2,2-dimethylpropylenediamine, tetramethylenediamine, pentamethylenediamine, hexamethylenediamine, 2,5-dimethyl-hexamethylenediamine, 3-methoxyhexamethylenediamine, heptamethylenediamine, 2,5-dimethylheptamethylenediamine, 3-methylheptamethylenediamine, 4,4-dimethylheptamethylene-diamine, octamethylenediamine, nonamethylenediamine, 5-methylnonamethylenediamine, 2,5-dimethylnonamethylene-diamine, decamethylenediamine, 1,10-diamino-1,10-dimethyldecane, 2,11-diaminododecane, 1,12-diamino-octadecane, 2,12-diamino octadecane and 2,17-diamino-eicosane; diaminosiloxane; 2,6-diamino-4-carboxylic benzene; and 3,3'-diamino-4,4'-dicarboxylic benzidine.

These diamines may be used either singly or in any combination thereof. Of these, 4,4'-diaminodiphenyl ether and 1,4-bis(4-aminophenoxy)benzene are particularly preferred because polymers which have moderate solubility in alkaline developers and high heat resistance can be provided.

Therefore, $R^2$ is a bivalent group derived from a diamine compound such as an aromatic diamine, heterocyclic diamine, alicyclic diamine or aliphatic diamine.

<Tetracarboxylic acid or the acid anhydride thereof>

Examples of the tetracarboxylic acid or the acid anhydride thereof used in the present invention include aromatic tet-racarboxylic dianhydrides such as pyromellitic dianhydride, 3,3',4,4'-benzophenone tetracarboxylic acid dianhydride, benzene-1,2,3,4-tetracarboxylic acid dianhydride, 2,2',3,3'-benzophenone tetracarboxylic acid dianhydride, 2,3,3'4'-benzophenone tetracarboxylic acid dianhydride, naphthalene-2,3,6,7-tetracarboxylic acid dianhydride, naphthalene-1,2,5,6-tetracarboxylic acid dianhydride, naphthalene-1,2,4,5-tetracarboxylic acid dianhydride, naphthalene-1,2,5,8-tetracarboxylic acid dianhydride, naphthalene-1,2,6,7-tetracarboxylic acid dianhydride, 4,8-dimethyl-1,2,3,5,6,7-hexahydronaphthalene-1,2,5,6-tetracarboxylic acid dianhydride, 4,8-dimethyl-1,2,3,5,6,7-hexahydronaphthalene-2,3,6,7-tetracarboxylic acid dianhydride, 2,6-dichloronaphthalene-1,4,5,8-tetracarboxylic acid dianhydride, 2,7-dichloronaphthalene-1,4,5,8-tetracarboxylic acid dianhydride, 2,3,6,7-tetrachloronapthalene-1,4,5,8-tetracarboxylic acid dianhydride, 1,4,5,8-tetrachloronaphthalene-2,3,6,7-tetracarboxylic acid dianhydride, 3,3',4,4'-diphenyltetracarboxylic acid dianhydride, 2,2',3,3'- diphenyltetracarboxylic acid dianhydride, 2,3,3',4'-diphenyltetracarboxylic acid dianhydride, 2,3",4,4"-p-terphenyltetracarboxylic acid dianhydride, 2,2",3,3"-p-terphenyltetracarboxylic acid dianhydride, 2,3,3",4"-p-terphenyltetracarboxylic acid dianhydride, 2,2-bis(2,3-dicarboxyphenyl propane dianhydride, 2,2-bis(3,4-dicarboxyphenyl)propane dianhydride, bis(2,3-dicarboxyphenyl) ether dianhydride, bis(3,4-dicarboxyphenyl) ether dianhydride, bis(2,3-dicarboxyphenyl)methane dianhydride, bis(3,4-dicarboxyphenyl)methane dianhydride, bis(2,3-dicarboxphenyl) sulfone dianhydride, bis(3,4-dicarboxyphenyl) sulfone dianhydride, 1,1-bis(2,3-dicarboxyphenyl)ethane dianhydride, 1,1-bis(3,4-dicarboxphenyl)ethane dianhydride, perylene-2,3,8,9-tetracarboxylic acid dianhydride, perylene-3,4,9,10-tetracarboxylic acid dianhydride, perylene-4,5,10,11-tetracarboxylic acid dianhydride, perylene-5,6,11,12-tetracarboxylic acid dianhydride, phenanthrene-1,2,7,8-tetracarboxylic acid dianhydride, phenanthrene-1,2,6,7-tetracarboxylic acid dianhydride and phenanthrene-1,2,9,10-tetracarboxylic acid dianhydride, and hydrogenated products thereof; alicyclic acid dianhydrides such as cyclopentane-1,2,3,4-tetracarboxylic acid dianhydride, cyclobutane-tetracarboxylic dianhydride, bicyclo[2,2,2]octa-7-en-2-exo,3-exo,5-exo,6-exotetracarboxylic acid 2,3:5,6-dianhydride and bicyclo[2,2,1]heptane-2-exo,3-exo,5-exo,6-exotetracarboxylic acid 2,3:5,6-dianhydride; and heterocyclic derivative acid dianhydrides such as pyrazine-2,3,5,6-tetracarboxylic acid dianhydride, pyrrolidine-2,3,4,5-tetracarboxylic acid dianhydride and thiophene-2,3,4,5-tetracarboxylic acid dianhydride.

These compounds may be used either singly or in any combination thereof. Of these, pyromellitic dianhydride, 3,3'4,4'-benzophenone tetracarboxylic acid dianhydride and a combination thereof are particularly preferred from the viewpoint of the realization of low thermal expansion, and good resistance to cracking and resolution.

Therefore, $R^1$ is a tetravalent organic group derived from a tetracarboxylic acid or the acid dianhydride thereof, such as an aromatic tetracarboxylic acid dianhydride or a hydrogenated product thereof, an alicyclic acid dianhydride, or a heterocyclic derivative acid dianhydride.

<Aminobenzene derivative>

In the present invention, as a compound which reacts with carboxyl groups of a tetracarboxylic acid or the acid dianhydride thereof to give the substituent group $Z^1$ represented by the formula (1), an aminobenzene derivative is used.

Examples of such an aminobenzene derivative include compounds represented by the following formula (5):

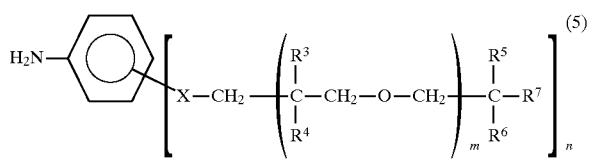

In the formula (5), X is a single bond, —O—, —CO—, —COO—, —OCO—, —OCOO—, —COCH$_2$O—, —S—, —SO—, —SO$_2$— or —SO$_2$O—, $R^3$, $R^4$, $R^5$, $R^6$ and $R^7$ are, independently of one another, a substituent group having a photopolymerizable carbon-carbon double bond, m is 0 or 1, and n is an integer of 1–3.

Typical examples of the substituent group having a photopolymerizable carbon-carbon double bond include acryloyloxymethylene and methacryloyloxymethylene groups. Besides, alkenyl groups having 2–6 carbon atoms, such as vinyl, propenyl, isopropenyl, butenyl, pentinyl, hexynyl and 2-ethylbutenyl groups, and substituted groups thereof may be mentioned. Specific examples of substituents capable of being bonded to the alkenyl groups having 2–6 carbon atoms include halogen atoms, a phenyl group, alkyl groups having 1–4 carbon atoms and alkoxy groups having 1–4 carbon atoms.

When X in the formula (5) is —COO—, the aminobenzene derivative is an aminobenzenecarboxylic ester represented by the following formula (6):

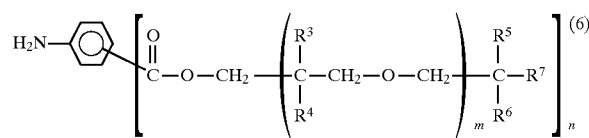

In the formula (6), $R^3$ to $R^7$, m and n have the same meaning as defined above.

Such an aminobenzenecarboxylic ester can be prepared in accordance with, for example, a process described below.

A nitrobenzoyl halide represented by the following formula (7) and an alcohol represented by the following formula (8) are first subjected to a dehydrohalogenation reaction to obtain a nitrobenzenecarboxylic ester represented by the following formula (9).

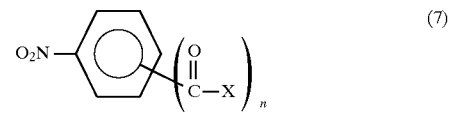

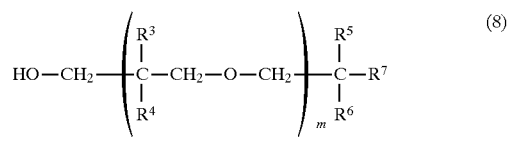

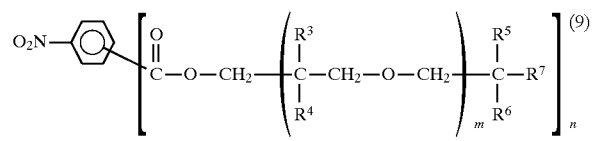

In the formula (7), X is a halogen atom such as chlorine, bromine, iodine or fluorine, n is an integer of 1–3. The number and bonding sites of the halogenocarbonyl groups bonded to the benzene ring may be suitably determined according to the structure of the intended aminobenzenecarboxylic ester. In these formulae (7) to (9), $R^3$ to $R^7$, m and n have the same meaning as defined above.

The above-described reaction is generally carried out in the presence of a base in an inert solvent. Examples of the inert solvent to be used include halogenated hydrocarbons such as methylene chloride, chloroform and trichloroethane; aliphatic and alicyclic hydrocarbons such as pentane, hexane, cyclopentane and cyclohexane; aromatic hydrocarbons such as benzene, toluene and xylene; nitriles such as acetonitrile; amines such as pyridine; amides such as dimethylformamide and dimethylacetamide; ethers such as tetrahydrofuran; and ketones such as acetone and cyclopentanone. Of these, the halogenated hydrocarbons are preferably used.

Examples of the base to be used include alkylamines such as trimethylamine and triethylamine; aromatic amines such as N,N-dimethylaniline; and aromatic heterocyclic compounds such as pyridine and dimethylaminopyridine. Of these, the alkylamines are preferably used.

The alcohol represented by the formula (8) is generally used in an amount at least equimolar to the halogenocarbonyl group of the nitrobenzoyl halide represented by the formula (7). The amount is preferably 1–2 moles.

The solvent is generally used in an amount of 2 to 20 times by weight as much as the total weight of the nitrobenzoyl halide represented by the formula (7) and the alcohol represented by the formula (8). The base is generally used in an amount of 1–5 moles, preferably 1–3 moles per mole of the nitrobenzoyl halide represented by the formula (7).

The reaction is generally conducted at a temperature of −20° to +60° C., preferably −10° to +30° C. for 0.5 to 24 hours, preferably 1 to 10 hours. If exothermic heat is generated at the initial stage of the reaction, it is preferable to cool the reaction system.

A nitro group of the thus-obtained nitrobenzenecarboxylic ester represented by the formula (9) can be then reduced, thereby obtaining the aminobenzenecarboxylic ester. As a reducing process, may be mentioned a process capable of selectively reducing the nitro group only, for example, a process in which a reducing agent and an acid are used in a suitable solvent.

Examples of the reducing agent to be used generally include metal halides such as stannous chloride and ferrous chloride; and metal powders such as tin powder and iron powder. Of these, the metal halides are preferred. Examples of the acid to be used include inorganic acids such as hydrochloric acid, sulfuric acid and nitric acid; organic acids such as formic acid and glacial acetic acid; and acid gases such as hydrogen chloride gas. Of these, the inorganic acids and acid gases are preferred. No limitation is imposed on the solvent to be used so far as it is inert in the reduction. For example, ethers such as diethyl ether, tetrahydrofuran and dioxane; alcohols such as methanol and ethanol; and water are used. Of these, the ethers are preferred.

The reducing agent is generally used in an amount of 1–20 moles, preferably 3–7 moles per mole of the nitrobenzenecarboxylic ester represented by the formula (9). The acid is generally used in an amount of 1–20 moles, preferably 3–8 moles per mole of the nitrobenzenecarboxylic ester represented by the formula (9). The solvent is generally used in an amount 3 to 100 times by weight as much as the total weight of the nitrobenzenecarboxylic ester represented by the formula (9), the reducing agent and the acid.

The reaction is generally conducted at a temperature of −20° to +60° C., preferably −5° to +30° C. for 0.5 to 24 hours, preferably 0.5 to 10 hours.

As another reducing process, may be mentioned a process in which a reducing agent such as sodium hydrosulfite and a charge transfer catalyst are used in the presence of a base. Its reaction system is generally a two-layer system composed of a water and an organic solvent. As the organic solvent, there may be preferably used a solvent inert in the reduction, for example, a halogenated hydrocarbon such as dichloromethane, chloroform, dichloroethane or monochloroethane.

Examples of the base to be used include potassium carbonate, sodium carbonate, potassium hydrogencarbonate, sodium hydrogencarbonate, potassium hydroxide and sodium hydroxide. Of these, the carbonates are preferred. Examples of the charge transfer catalyst to be used include 1,1'-di-n-heptyl-4,4'-bipyridinium dibromide, 1,1'-di-n-octyl-4,4'-bipyridinium dibromide and 1,1'-di-n-nonyl-4,4'-bipyridinium dibromide. Of these, 1,1'-di-n-octyl-4,4'-bipyridinium dibromide is preferred.

The base is generally used in an amount of 4–10 moles, preferably 4–6 moles per mole of the nitrobenzenecarboxylic ester represented by the formula (9). The reducing agent is generally used in an amount of 4–10 moles, preferably 4–6 moles per mole of the nitrobenzenecarboxylic ester represented by the formula (9). The charge transfer catalyst is generally used in an amount of 0.05–1 mole, preferably 0.1–0.5 moles per mole of the nitrobenzene-carboxylic ester represented by the formula (9).

The reaction is generally conducted at a temperature of −5° to +80° C., preferably +20° to +50° C. for 0.5 to 24 hours, preferably 2 to 10 hours.

After completion of the reaction, the aminobenzenecarboxylic ester can be isolated from the liquid reaction mixture in accordance with a method known per se in the art. Examples thereof include a method in which the liquid reaction mixture is neutralized, and the aminobenzenecarboxylic ester is then extracted with a solvent and isolated by column chromatography or the like, and a method in which the liquid reaction mixture is washed with an acid and/or a base to extract the carboxylic ester.

The aminobenzenecarboxylic ester has a structure represented by the formula (6). In this ester, an amino group and one to three carboxylic ester residues are boned to the benzene ring. The bonding site of the carboxylic ester residue to the amino group may be any of ortho, meta and para positions.

Specific examples of the aminobenzenecarboxylic ester include tris(methacryloyl)pentaerythritol o-aminobenzoate, tris(acryloyl)pentaerythritol o-aminobenzoate tris(methacryloyl)pentaerythritol m-aminobenzoate, tris(acryloyl)pentaerythritol m-aminobenzoate, tris(methacryloyl)pentaerythritol p-aminobenzoate, tris(acryloyl)pentaerythritol p-aminobenzoate, tris(methacryloyl)pentaerythritol di-5-aminoisophthalate, tris(acryloyl)pentaerythritol di-5-aminoisophthalate, pentakis(methacryloyl)dipentaerythritol o-aminobenzoate, pentakis(acryloyl)dipentaerythritol o-aminobenzoate, pentakis(methacryloyl)dipentaerythritol m-aminobenzoate, pentakis(acryloyl)dipentaerythritol m-aminobenzoate, pentakis(methacryloyl)dipentaerythritol p-aminobenzoate and pentakis(acryloyl)dipentaerythritol p-aminobenzoate.

Of these, tris(methacryloyl)pentaerythritol p-aminobenzoate is particularly preferred because it is excellent in points of synthesizing cost, handling properties, sensitivity, resolution and the like.

When various kinds of substituted nitrobenzenes are used in place of the nitrobenzoyl halide represented by the formula (7), aminobenzene derivatives in which X varies according to the substituent groups of the substituted nitrobenzenes used can be obtained.

For example, if pentaerythritol trimethacrylate of the alcohol represented by the formula (8) is indicated by HO—CH$_2$R, pentaerythritol trimethacryloyl mono(p-nitrophenyl) ether is obtained by subjecting p-bromonitrobenzene and such an alcohol to a dehydrohalogenation reaction in accordance with the following reaction scheme.

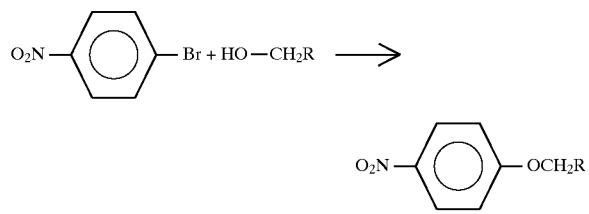

Pentaerythritol trimethacryloyl mono(p-aminophenyl) ether is obtained by selectively reducing the nitro group of this compound. In this case, X is —O—.

Similarly, when the following compound:

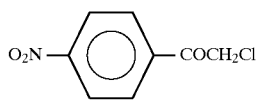

is used in place of p-bromonitrobenzene, pentaerythritol trimethacryloyl mono(p-aminophenylcarbonylmethyl) ether is obtained. In this case, X is —COCH$_2$O—.

Similarly, when the following compound:

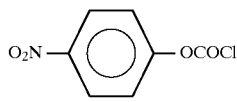

is used in place of p-bromonitrobenzene, pentaerythritol trimethacryloyl mono(p-aminophenyloxy)carbonyl ester is obtained. In this case, X is —OCOO—.

Similarly, when the following compound:

is used in place of p-bromonitrobenzene, tris(methacryloyl) pentaerythritol p-aminobenzenesulfonate is obtained. In this case, X is —SOO—.

Similarly, when the following compound:

is used in place of p-bromonitrobenzene, tris(methacryloyl) pentaerythritol of p-aminobenzenesulfonate is obtained. In this case, X is —SO$_2$O—.

In order to synthesize the compound (A1) with the actinic ray-sensitive functional group $Z^1$ represented by the formula (1) introduced into a polyamic compound at both terminals thereof, as described above, a tetracarboxylic acid or the anhydride thereof is added to a mixture of a diamine compound and an aminobenzene derivative, thereby subjecting these components to a condensation reaction in accordance with a method known per se in the art. In order to introducing the actinic ray-sensitive functional group at both terminals, the individual components are used in the following proportions. Namely, (1) the diamine compound is preferably used in a proportion of 0.850–0.990 moles, more preferably 0.900–0.970 moles per mole of the tetracarboxylic acid or the anhydride thereof, (2) the aminobenzene derivative is generally used in a proportion of 0.400–0.020 moles, preferably 0.110–0.040 moles, more preferably 0.100–0.050 moles per mole of the diamine compound, and (3) the diamine compound and the aminobenzene derivative are generally used in a proportion of 1.100–0.900 moles, preferably 1.100–0.950 moles, more preferably 1.060–0.990 moles in total per mole of the tetracarboxylic acid or the anhydride thereof. In order to conduct the condensation reaction, it is only necessary to react the individual components with each other in accordance with a method known per se in the art in a polar organic solvent such as dimethylacetamide. From the viewpoint of reaction conditions, there may be mentioned, for example, a method in which the components are reacted for 0.5–10 hours, preferably 1–5 hours while chilling with ice water, and then for 1–50 hours, preferably 5–30 hours at room temperature. However, the polyamic compounds (A1) used in the present invention are not limited to those obtained by specific synthesizing processes.

<Trimellitic acid derivative>

In the present invention, as a compound which gives the substituent group $Z^2$ represented by the formula (2) to both terminals of a polyamic compound, a trimellitic acid derivative having a specific structure is used. That is, such a trimellitic acid derivative is represented by the following formula (10):

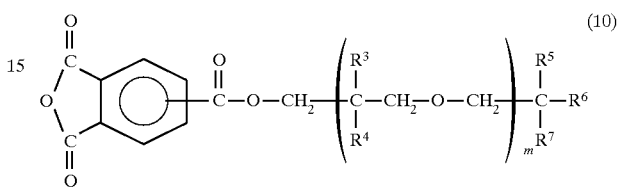

wherein $R^3$, $R^4$, $R^5$, $R^6$ and $R^7$ are, independently of one another, a substituent group having a photopolymerizable carbon-carbon double bond, and m is 0 or 1.

Typical examples of the substituent group having a photopolymerizable carbon-carbon double bond include acryloyloxymethylene and methacryloyloxymethylene groups. Besides, alkenyl groups having 2–6 carbon atoms, such as vinyl, propenyl, isopropenyl, butenyl, pentinyl, hexynyl and 2-ethylbutenyl groups, and substituted groups thereof may be mentioned. Specific examples of substituents capable of being bonded to the alkenyl groups having 2–6 carbon atoms include halogen atoms, a phenyl group, alkyl groups having 1–4 carbon atoms and alkoxy groups having 1–4 carbon atoms.

Such a trimellitic acid derivative can be synthesized, for example, by subjecting an anhydrotrimellityl halide represented by the following formula (11) and an alcohol represented by the following formula (12) to a dehydrohalogenation reaction (esterification reaction).

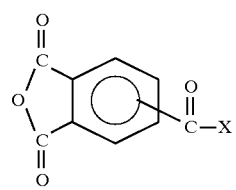

In the formula (11), X is a halogen atom.

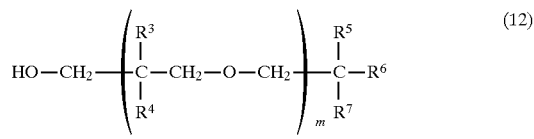

In the formula (12), $R^3$, $R^4$, $R^5$, $R^6$ and $R^7$ are, independently of one another, a substituent group having a photopolymerizable carbon-carbon double bond, and m is 0 or 1.

The above-described reaction is generally carried out in the presence of a base in an inert solvent. Examples of the inert solvent to be used include halogenated hydrocarbons such as methylene chloride, chloroform and trichloroethane; aliphatic and alicyclic hydrocarbons such as pentane, hexane, cyclopentane and cyclohexane; aromatic hydrocarbons such as benzene, toluene and xylene; nitriles such as acetonitrile; amines such as pyridine; amides such as dimethylformamide and dimethylacetamide; ethers such as tetrahydrofuran; and ketones such as acetone and cyclopentanone. Of these, the halogenated hydrocarbons are preferably used.

Examples of the base to be used includes alkylamines such as trimethylamine and triethylamine; aromatic amines such as N,N-dimethylaniline; and aromatic heterocyclic compounds such as pyridine and dimethylaminopyridine. Of these, the alkylamines are preferably used.

The alcohol represented by the formula (12) is generally used in an amount of 1–5 moles, preferably 1–1.5 moles per mole of the anhydrotrimellityl halide represented by the formula (11). The solvent is generally used in an amount 2 to 20 times by weight as much as the total weight of the anhydrotrimellityl halide of the formula (11) and the alcohol represented by the formula (12). The base is generally used in an amount of 1–5 moles, preferably 1–3 moles per mole of the anhydrotrimellityl halide of the formula (11).

The reaction is generally conducted at a temperature of −10° to +80° C., preferably −5° to +30° C. for 0.5 to 24 hours, preferably 1 to 5 hours.

After completion of the reaction, the trimellitic acid derivative can be isolated from the liquid reaction mixture in accordance with a method known per se in the art. Examples thereof include a method in which the product is recrystallized from a solvent such as chloroform, and a method in which the product is reprecipitated and purified with a mixed solvent of tetrahydrofuran and toluene.

As a specific example of the above-described reaction, for example, the use of a compound represented by the following formula (13) as the anhydrotrimellityl halide and an alcohol represented by the following formula (14) as the alcohol obtains a trimellitic acid derivative represented by the following formula (15).

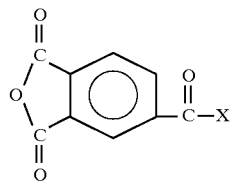
(13)

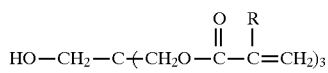
(14)

wherein R in the formula (14) is a hydrogen atom or a lower alkyl group.

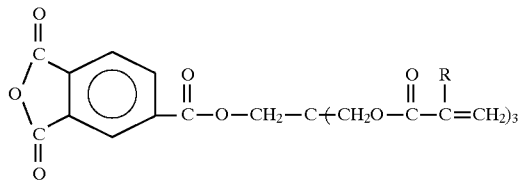
(15)

Examples of the alcohol represented by the formula (14) include triacryloylpentaerythritol and trimethacryloylpentaerythritol. The esterification reaction is generally conducted at a meta position to the acid anhydride group.

As particularly preferred examples of the trimellitic acid derivative, may be mentioned tris(acryloyl)pentaerythritol anhydrotrimellitate [a compound in which R in the formula (15) is H] and tris(methacryloyl)pentaerythritol anhydrotrimellitate [a compound in which R in the formula (15) is a methyl group] because they are excellent in points of synthesizing cost, handling properties, sensitivity, resolution and the like.

In order to synthesize the compound (A2) with the actinic ray-sensitive functional group $Z^2$ represented by the formula (2) introduced into a polyamic compound at both terminals thereof, as described above, a trimellitic acid derivative and a tetracarboxylic acid or the anhydride thereof are added to a diamine compound, thereby subjecting these components to a condensation reaction in accordance with a method known per se in the art. Alternatively, a tetracarboxylic acid or the anhydride thereof may be added to a mixture of a diamine compound and a trimellitic acid derivative, thereby subjecting these components to a condensation reaction in accordance with a method known per se in the art. In order to introducing the actinic ray-sensitive functional group at both terminals, the individual components are used in the following proportions. Namely, (1) the tetracarboxylic acid or the anhydride thereof is preferably used in a proportion of 0.850–0.990 moles, more preferably 0.900–0.970 moles per mole of the diamine compound, (2) the trimellitic acid derivative is generally used in a proportion of 0.400–0.020 moles, preferably 0.110–0.040 moles, more preferably 0.100–0.050 moles per mole of the tetracarboxylic acid or the anhydride thereof, and (3) the tetracarboxylic acid or the anhydride thereof and the trimellitic acid derivative are generally used in a proportion of 1.100–0.900 moles, preferably 1.100–0.990 moles, more preferably 1.060–1.020 moles in total per mole of the diamine compound. In order to conduct the condensation reaction, it is only necessary to react the individual components with each other in accordance with a method known per se in the art in a polar organic solvent such as dimethylacetamide. From the viewpoint of reaction conditions, there may be mentioned, for example, a method in which the components are reacted for 0.5–10 hours, preferably 1–5 hours while chilling with ice water, and then for 1–50 hours, preferably 5–30 hours at room temperature. However, the polyamic compounds (A2) used in the present invention are not limited to those obtained by specific synthesizing processes.

(B) Photosensitive auxiliary having a photopolymerizable functional group

No particular limitation is imposed on the photosensitive auxiliary useful in the practice of the present invention so far as it is generally known as a photosetting monomer.

Typical examples of the photosensitive auxiliary include (meth)acrylic compounds such as pentaerythritol triacrylate.

Examples of the acrylic compounds include acrylic acid, methyl acrylate, ethyl acrylate, n-propyl acrylate, isopropyl acrylate, n-butyl acrylate, isobutyl acrylate, cyclohexyl acrylate, benzyl acrylate, carbitol acrylate, methoxyethyl acrylate, ethoxyethyl acrylate, butoxyethyl acrylate, hydroxyethyl acrylate, hydroxypropyl acrylate, butylene glycol monoacrylate, N,N-dimethylaminoethyl acrylate, N,N-diethylaminoethyl acrylate, glycidyl acrylate, tetrahydrofurfuryl acrylate, pentaerythritol monoacrylate, trimethylolpropane monoacrylate, allyl acrylate, 1,3-propylene glycol diacrylate, 1,4-butylene glycol diacrylate, 1,6-hexane glycol diacrylate, neopentyl glycol diacrylate, dipropylene glycol diacrylate, 2,2-bis(4-acryloxydiethoxyphenyl) propane, 2,2-bis(4-acryloxypropyloxyphenyl)propane, trimethylolpropane diacrylate, pentaerythritol diacrylate, trimethylolpropane triacrylate, pentaerythritol triacrylate, triacrylformal, tetramethylolmethane tetraacrylate, tris(2-hydroxy-ethyl) isocyanuric acidacrylate, compounds represented by the following formula (16):

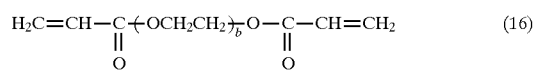
(16)

wherein b means an integer of 1–30, compounds represented by the following formula (17):

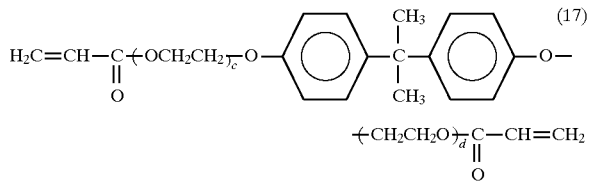

(17)

wherein c and d denote integers satisfying c+d=2–30, a compound represented by the following formula (18):

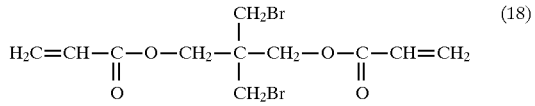

(18)

and a compound represented by the following formula (19):

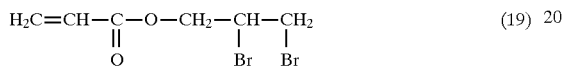

(19)

Examples of the methacrylic compounds include methacrylic acid, methyl methacrylate, ethyl methacrylate, propyl methacrylate, isopropyl methacrylate, butyl methacrylate, isobutyl methacrylate, cyclohexyl methacrylate, benzyl methacrylate, octyl methacrylate, ethylhexyl methacrylate, methoxyethyl methacrylate, ethoxyethyl methacrylate, butoxyethyl methacrylate, hydroxyethyl methacrylate, hydroxypropyl methacrylate, hydroxybutyl methacrylate, hydroxypentyl methacrylate, N,N-dimethylaminoethyl methacrylate, N,N-diethylaminoethyl methacrylate, glycidyl methacrylate, tetrahydrofurfuryl methacrylate, methacryloxypropyltrimethoxysilane, allyl methacrylate, trimethylolpropane monomethacrylate, pentaerythritol monomethacrylate, 1,3-butylene glycol dimethacrylate, 1,6-hexane glycol dimethacrylate, neopentyl glycol dimethacrylate, 2,2-bis(4-methacryloxy-diethoxyphenyl)propane, trimethylolpropane dimethacrylate, pentaerythritol dimethacrylate, trimethylolpropane trimethacrylate, pentaerythritol trimethacrylate, tetramethylolmethane tetramethacrylate, tris(2-hydroxyethyl) isocyanuric acid methacrylate, compounds represented by the following formula (20):

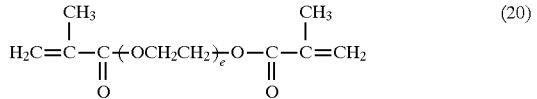

(20)

wherein e means an integer of 1–30, compounds represented by the following formula (21):

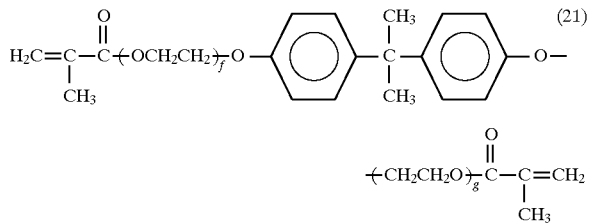

(21)

wherein f and g denote integers satisfying f+g=1–30, a compound represented by the following formula (22):

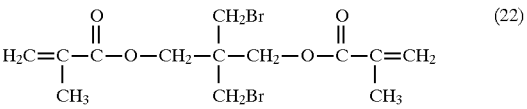

(22)

and a compound represented by the following formula (23):

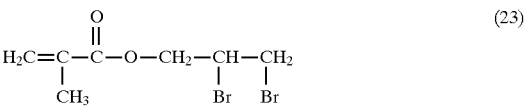

(23)

These compounds may be used either singly or in any combination thereof. Of these, pentaerythritol triacrylate and the compound (b=3 or 4) represented by the formula (16) are particularly preferred.

No particular limitation is imposed on the amount of the photosensitive auxiliary to be used so far as it is compatible with the polyamic compound. However, if the amount to be used is extremely great, the photosensitive auxiliary involves problems that it is difficult to be decomposed or removed upon the polyimidation of the polyamic compound by the heat treatment, and that the residual stress of the resulting film is increased, and so a substrate of a semiconductor device becomes liable to cause deformation such as warpage.

Therefore, the photosensitive auxiliary is desirably used in a proportion of 10–50 parts by weight, preferably 15–45 parts by weight, more preferably 20–35 parts by weight per 100 parts by weight of (A) the polyamic compound.

(C) Photopolymerization initiator

Examples of the photopolymerization initiator useful in the practice of the present invention include Michler's ketone, benzoin, 2-methylbenzoin, benzoin methyl ether, benzoin ethyl ether, benzoin isopropyl ether, benzoin butyl ether, 2-t-butylanthra-quinone, 1,2-benzo-9,10-anthraquinone, anthraquinone, methylanthraquinone, 4,4'-bis(diethylamino)benzophenone, acetophenone, benzophenone, thioxanthone, 1,5-acenaphthene, 2,2-dimethoxy-2-phenylacetophenone, 1-hydroxycyclohexyl phenyl ketone, 2-methyl-[4-(methylthio)phenyl]-2-morpholino-1-propanone, diacetylbenzyl, benzyldimethyl ketal, benzyldiethyl ketal, diphenyl disulfide, anthracene, phenanthrenequinone, riboflavin tetrabutyrate, acrylorange, erythrosine, phenanthrenequinone, 2-isopropylthioxanthone, 2,6-bis(p-diethylaminobenzylidene)-4-methyl-4-azacyclohexanone, 6-bis(p-dimethylaminobenzylidene)-cyclopentanone, 2,6-bis(p-diethylaminobenzylidene)-4-phenylcyclohexanone, aminostyryl ketone represented by the following formula (24):

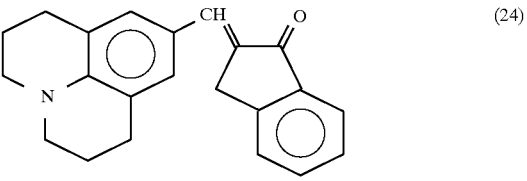

(24)

3-ketocoumarin compounds represented by the following formula (25):

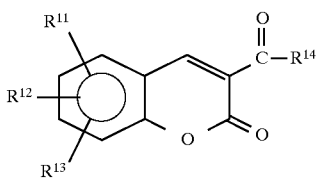 (25)

wherein $R^{14}$ is an aromatic carbon ring or heterocycle having 5–20 ring-forming atoms, and $R^{11}$, $R^{12}$ and $R^{13}$ are, independently of one another, a hydrogen atom, a hydroxyl group, or an alkyl, dialkylamino, alkoxy or acyloxy group having 1–5 carbon atoms, biscoumarin compounds represented by the following formula (26):

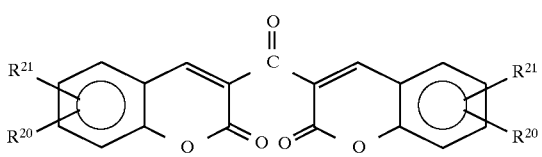 (26)

wherein $R^{20}$ and $R^{21}$ are, independently of each other, a hydrogen atom, or an alkyl, dialkylamino, alkoxy or acyloxy group having 1–5 carbon atoms, N-phenylglycine, N-phenyldiethanolamine and 3,3',4,4'-tetra(t-butyl peroxycarbonyl)benzophenone.

No particular limitation is imposed on the amount of the photopolymerization initiator to be used. However, it is generally used in a proportion of 0.1–10 parts by weight, preferably 0.1–5 parts by weight, more preferably 1–5 parts by weight per 100 parts by weight of (A) the polyamic compound.

(D) Solvent

Examples of the solvent useful in the practice of the present invention include polar solvents such as N-methyl-2-pyrrolidone, N,N-dimethylacetamide, N,N-dimethylformamide, dimethyl sulfoxide, tetramethylurea, hexamethylphosphoric triamide, and γ-butyrolactone.

Besides these polar solvents, ketones such as acetone, methyl ethyl ketone, methyl isobutyl ketone and cyclohexanone; esters such as methyl acetate, ethyl acetate, butyl acetate, diethyl oxalate and diethyl malonate; ethers such as diethyl ether, ethylene glycol dimethyl ether, diethylene glycol dimethyl ether and tetrahydrofuran; halogenated hydrocarbons such as dichloromethane, 1,2-dichloroethane, 1,4-dichlorobutane, trichloroethane, chlorobenzene and o-dichlorobenzene; and hydrocarbons such as hexane, heptane, octane, benzene, toluene and xylene may also be used.

These solvent may be used either singly or in any combination thereof. Of these, N,N-dimethylacetamide and N-methyl-2-pyrrolidone are particularly preferred.

The solvent is used in an amount sufficient to uniformly dissolve the individual components. In particular, it is used in an amount sufficient to dissolve (A) the polyamic compound. The proportion of the solvent to be used varies according to the kinds of the solvent and polyamic acid used. However, it is generally used in an amount 3–25 times, preferably 5–20 times, more preferably 6–10 times by weight as much as (A) the polyamic compound.

(E) Other additives

In the compositions according to the present invention, there may be further used various additives such as an adhesion auxiliary, leveling agent and polymerization inhibitor as needed.

Among the various additives, 1H-tetrazole, 5,5'-bis-1H-tetrazole or a derivative thereof is added, whereby corrosion against copper and copper alloys can be prevented, and so the adhesion of the polyimide film to a substrate can be improved, and the photosensitive film can be prevented from remaining without being developed. These facts have been found by the present inventors for the first time.

1H-Tetrazole and derivatives thereof can be represented by the following formula (27):

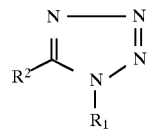 (27)

5,5'-Bis-1H-tetrazole and derivatives thereof are compounds represented by the following formula (28):

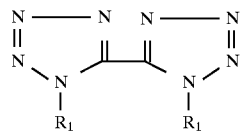 (28)

Definition of $R_1$

In the formulae (27) and (28), $R_1$ is a hydrogen atom, an alkyl group having 1–10 carbon atoms, an alkenyl group having 2–10 carbon atoms, an allyl group having 3–10 carbon atoms, an alicyclic group having 3–6 carbon atoms, a phenyl group, a substituted phenyl group represented by the following formula (29):

 (29)

wherein n is an integer of 1–3, and X is an alkyl group having 1–10 carbon atoms, an alkoxyl group having 1–10 carbon atoms, —NR'R" (R' and R" are, independently from each other, a hydrogen atom or a methyl, ethyl, acetyl or ethylcarbonyl group), —COOH, —COOCH$_3$, —NO$_2$, —OH, —SH or —SCH$_3$, or a substituted methyl group represented by the following formula (30):

 (30)

wherein m is an integer of 1–10, and Y is —COOH, —NR'R" (R' and R" are, independently from each other, a hydrogen atom or a methyl, ethyl, acetyl or ethylcarbonyl group), a phenyl group or a substituted phenyl group represented by the formula (29).

Among these substituents, preferable specific examples of $R_1$ include a hydrogen atom; alkyl groups having 1–6 carbon atoms, such as methyl, ethyl, propyl, isopropyl, butyl, isobutyl, s-butyl, t-butyl, pentyl, 3-methyl-1-butyl, hexyl and 4-methyl-1-pentyl group; alicyclic groups having 3–6 carbon atoms, such as cyclopropyl, cyclopentyl, 2-methylcyclopentyl and cyclohexyl groups; a phenyl group; substituted phenyl groups represented by the general formula (29) in which n is 1 or 2, and X is an alkyl group having 1–6 carbon atoms, amino group, methylamino group, acetamide group, —SH or —OH, for example, methylphenyl, dimethylphenyl, butylphenyl, t-butylphenyl, aminophenyl, aminomethylphenyl, acetamidophenyl, mercaptophenyl and hydroxyphenyl groups; and substituted methyl groups represented by the general formula (30) in which m is 1 or 2, and Y is a phenyl, amino, methylamino, dimethylamino or acetamide group, for example, aralkyl groups such as benzyl and phenethyl groups, and (substituted) aminomethyl groups such as aminomethyl, amino ethyl, methylaminomethyl, dimethylaminomethyl and acetylamino-methyl groups.

Definition of $R_2$

In the formula (27), $R_2$ is a hydrogen atom, a hydroxyl group, a cyano group, an alkyl group 1–10 carbon atoms, an alkenyl group having 2–10 carbon atoms, an alkinyl group having 2–10 carbon atoms, an alicyclic group having 3–6 carbon atoms, a phenyl group, a substituted phenyl group, —$OR_3$ ($R_3$ is an alkyl group 1–10 carbon atoms, an alkenyl group having 2–10 carbon atoms, an alkinyl group having 2–10 carbon atoms, a phenyl group or a substituted phenyl group represented by the formula (29)), a substituted methyl group represented by the following formula (31):

  (31)

wherein k is an integer of 1–10, and Z is a halogen atom, an amino group, —NR'R" (R' and R" are, independently from each other, a hydrogen atom or a methyl, ethyl, acetyl or ethylcarbonyl group), a phenyl group, a substituted phenyl group represented by the formula (29), —SH, —$SR_4$ ($R_4$ is an alkyl group 1–10 carbon atoms, an alkenyl group having 2–10 carbon atoms, an alkinyl group having 2–10 carbon atoms, a phenyl group or a substituted phenyl group represented by the formula (29)), —C($NH_2$)H—($CH_2$)$_n$—$CH_3$ (n: 1–5) or —C($NHCH_3$)H—($CH_2$)$_n$—$CH_3$ (n: 0–5), or a group represented by the following formula (32):

$R_5$—A—  (32)

wherein A is —CO—, —NHCO—, —C(=N—OH)—, —CH(OH)—, —CH($NH_2$)—, —CH(Cl)— or —CH(Br)—, and $R_5$ is an alkyl group having 1–20 carbon atoms, an alkenyl group having 2–20 carbon atoms, an alicyclic group having 3–6 carbon atoms, a phenyl group, a substituent phenyl group represented by the formula (29), a substituted methyl group represented by the formula (31) or a group represented by the following formula (33):

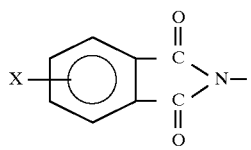  (33)

wherein X is an alkyl group having 1–10 carbon atoms, an alkoxyl group having 1–10 carbon atoms, an amino group, —NR'R" (R' and R" are, independently from each other, a hydrogen atom or a methyl, ethyl, acetyl or ethylcarbonyl group), —COOH, —$COOCH_3$, —$NO_2$, —OH, —SH or —$SCH_3$.

Preferable specific examples of $R_2$ include a hydrogen atom; a cyano group; alkyl groups having 1–6 carbon atoms, such as methyl, ethyl, propyl, isopropyl, butyl, isobutyl, s-butyl, t-butyl, pentyl, 3-methyl-1-butyl, hexyl and 4-methyl-1-pentyl group; alicyclic groups having 3–6 carbon atoms, such as cyclopropyl, cyclopentyl, 2-methylcyclopentyl and cyclohexyl groups; a phenyl group; substituted phenyl groups having a $C_1$-$C_6$ alkyl group, such as methylphenyl, ethylphenyl, propylphenyl, butylphenyl, pentylphenyl and hexylphenyl groups; (substituted) aminophenyl groups such as aminophenyl, methylaminophenyl and acetamidophenyl groups; and substituted methyl groups represented by the general formula (31) in which k is 1 or 2, and Z is a phenyl, amino, methylamino, dimethylamino or acetamide group, for example, aralkyl groups such as benzyl and phenethyl groups, and (substituted) aminomethyl groups such as aminomethyl, amino ethyl, methylaminomethyl, dimethylaminomethyl and acetylaminomethyl groups.

As preferable specific examples of 1H-tetrazole, 5,5'-bis-1H-tetrazole and derivatives thereof, may be mentioned unsubstituted 1H-tetrazole; 5-substituted 1H-tetrazoles such as 5-methyl-1H-tetrazole, 5-phenyl-1H-tetrazole and 5-amino-1H-tetrazole; 1-substituted 1H-tetrazoles such as 1-methyl-1H-tetrazole; and 1,5-substituted 1H-tetrazole such as 1-phenyl-5-mercapto-1H-tetrazole. Of these, 1H-tetrazole and 5-substituted 1H-tetrazoles, in which $R_1$ is H, are particularly preferred.

The 1H-tetrazole, 5,5'-bis-1H-tetrazole and derivatives thereof (hereinafter referred to as "1H-tetrazoles") used in the present invention bring about a particularly high effect where $R_1$ is a hydrogen atom. The reason for it is as follows. When a hydrogen atom is bonded to a nitrogen atom at a 1-position of 1H-tetrazole, such a hydrogen ion (proton) in an aqueous solution shows acidity of the same degree as acetic acid, and so a salt can be easily formed with a metal or base. Accordingly, the 1H-tetrazoles react to copper or a copper alloy to form a copper salt. This copper salt is stable to oxidation and inhibits the isolation of a copper ion. Besides, the 1H-tetrazoles are considered to inhibits a reaction of a carboxyl group with copper or a copper alloy to prevent the formation of copper carboxylate. On the other hand, the 1H-tetrazoles in which $R_1$ is another substituent than a hydrogen atom, show basicity and are considered to have an action to neutralize carboxyl groups in the polyamide acid rather than an action on copper. However, even use of these tetrazoles brings about action and effect that the rate of residual film is improved though its effect is somewhat lowered.

The 1H-tetrazoles are generally used in a proportion of 0.05–20 parts by weight, preferably 0.1–5 parts by weight, more preferably 0.3–3.0 parts by weight per 100 parts by weight of the polyamic compound (in terms of solid content). If this proportion is too low, the effect of the addition becomes small. If the proportion is too high on the other hand, the effect is not brought about correspondingly to such a proportion.

The 1H-tetrazoles are generally added to a solution of the polyamic compound into a resin composition (solution). The resultant composition is used in applications for coating on a substrate or the like to form a film.

Pattern forming process

The photosensitive resin composition according to the present invention is used in the following manner. The composition is first coated on a suitable substrate, for example, a silicon wafer, or a ceramic or aluminum base. Examples of a coating process include spin coating making use of a spin coater, spray coating making use of a spray coater, dipping, printing and roll coating. After the composition is then prebaked at a low temperature of 60°–80° C. to dry the coating film, the coating film is exposed to actinic rays according to the desired pattern. As the actinic rays, there may be used X-rays, electron rays, ultraviolet rays, visible rays and the like. Those having a wavelength ranging from 200 to 500 nm are preferred.

The unexposed portion is then dissolved in a developer to remove it, thereby obtaining a relief pattern. In the present invention, alkaline developers and alkaline aqueous solutions may be used as the developer.

The alkaline developers are developers obtained by dissolving a basic compound in a solvent containing at least 50% of an organic solvent. Examples of the organic solvent include polar solvents such as N-methyl-pyrrolidone, N-acetylpyrrolidone, N,N'-dimethylformamide, N,N'-dimethylacetamide, dimethyl sulfoxide and γ-butyrolactone.

Besides, general organic solvents, such as alcohols such as methanol and ethanol, aromatic hydrocarbons such as toluene and xylene, ketones such as acetone and methyl ethyl ketone, and ethers such as tetrahydrofuran and dioxane, and water may be used in combination with these polar solvents. On the other hand, the alkaline aqueous solutions are solutions obtained by dissolving a basic compound in water.

Examples of the basic compound used include the hydroxides, carbonates, bicarbonates, silicates, phosphates, pyrophosphates, acetates and amine salts of alkali metals and quaternary ammonium. Specific examples thereof include sodium hydroxide, lithium hydroxide, potassium hydroxide, ammonium hydroxide, trimethylbenzylammonium hydroxide, tetramethylammonium hydroxide, sodium carbonate, potassium carbonate, sodium hydrogencarbonate, sodium silicate, sodium phosphate, sodium pyrophosphate, sodium acetate, monoethanolamine, diethanolamine, triethanolamine and choline. However, the basic compounds are not limited thereto.

The amount of the basic compound used is generally 0.001–50 parts by weight, preferably 0.05–30 parts by weight per 100 parts by weight of the solvent or water. If the amount used is too small, the resulting developer tends to lower its developing ability. If the amount is too great, the basic compound is incompletely dissolved into an uneven solution, or the alkaline concentration of the resulting solution becomes too high, so that the solubility of the polyamic compound in such a solution becomes too high, resulting in surface roughness at the unexposed portion.

As the developer, the alkaline developer and alkaline aqueous solution may be used either singly or in combination. When the alkaline developer and alkaline aqueous solution are used in combination, the amount of the organic solvent used is generally 0.1–100 parts by weight, preferably 1.0–50 parts by weight per 100 parts by weight of water. The alkaline aqueous solution, which is safer for human body and cheap, is preferably used as the developer.

The polyamic compound used in the present invention is preferably such that a film 20 μm thick formed therefrom is completely dissolved within 5 minutes in a 10% aqueous solution of trimethylammonium halide in a state of paddle dipping at 25° C.

As a developing process, there may be used various methods such as spray development, paddle development, dip development and ultrasonic development.

The relief pattern formed by the development is washed with a rinsing liquid to remove the developer. Examples of the rinsing liquid include methanol, ethanol, isopropanol and water. These rinsing liquids are used singly or in combination. A rinsing liquid composed of water alone or obtained by mixing alcohols as main components is particularly preferred.

A heat treatment is then conducted to form an imide ring, thereby polyimidating the polyamide acid compound to obtain a final pattern having high heat resistance.

The photosensitive polyimide resin compositions according to the present invention can be used not only in applications related to semiconductor devices, but also as layer insulation films for multi-layer circuits, cover coats for flexible copper-clad sheets, solder resist films, alignment films for liquid crystals, and the like.

ADVANTAGES OF THE INVENTION

According to the present invention, there can be provided photosensitive polyimide resin compositions which have such features that they are excellent in resist properties such as sensitivity, good in storage stability, easy to conduct exposure and development processes, unnecessary to provide explosion-proof apparatus upon development, high in safety for operators upon development and gentle in development waste to environment. The provision of the photosensitive polyimide resin compositions, which can be expected to have effects for reducing developer cost and waste treatment cost and the like, has a great advantage from an economical point of view. The photosensitive polyimide resin compositions of the present invention are useful as surface-protecting films and layer insulation films for semiconductor devices, and moreover can be used as layer insulation films for multi-layer circuits, cover coats for flexible copper-clad sheets, solder resist films, alignment films for liquid crystals, or the like.

EMBODIMENTS OF THE INVENTION

The present invention will hereinafter be described more specifically by the following synthesis example, examples and comparative examples. However, the present invention is not limited to these examples only.

SYNTHESIS EXAMPLE 1

Synthesis of tris(methacryloyl)pentaerythritol p-aminobenzoate (1) A reactor was charged with 13.1 g of pentaerythritol trimethacrylate, 4.1 g of triethylamine and 35 ml of methylene chloride. While stirring the contents and chilling with ice water, 6.7 g of p-nitrobenzoyl chloride and 25 ml of methylene chloride were added dropwise. Thereafter, a reaction was conducted for 2 hours while chilling ice water and subsequently for 2 hours at room temperature.

After completion of the reaction, chloroform and water were added to the liquid reaction mixture, and hydrochloric acid was then added to separate and collect a chloroform layer. Chloroform was distilled out of the chloroform layer under reduced pressure, and the resultant pale-yellow oily matter was purified by column chromatography, thereby obtaining 15.1 g (yield: 85.8%) of tris(methacryloyl) pentaerythritol p-nitrobenzoate.

(2) A reactor was charged with 15.1 g of tris (methacryloyl)pentaerythritol p-nitrobenzoate, 35.1 g of stannous chloride and 150 ml of tetrahydrofuran. While stirring the contents and chilling with ice water, hydrogen chloride gas was introduced therein. After a reaction was conducted for 1 hour while chilling ice water and subsequently for 1 hour at room temperature, water and sodium carbonate were added to the liquid reaction mixture to weakly alkalify it. The liquid reaction mixture was subjected to extraction with chloroform. Chloroform was distilled out of the chloroform layer under reduced pressure, and the residue was then purified by column chromatography, thereby obtaining 13.8 g (yield: 92.3%) of tris(methacryloyl) pentaerythritol p-aminobenzoate.

EXAMPLE 1

A reactor was charged with 57.6 g (0.288 mol) of 4,4'-diaminodiphenyl ether, 11.02 g (0.024 mol) of tris (methacryloyl)pentaerythritol p-aminobenzoate as an amine for terminal modification and 806.7 g of dimethylacetamide to prepare a uniform solution. While stirring the solution and chilling with ice water, 96.6 g (0.300 mol) of 3,3',4,4'-benzophenonetetracarboxylic acid dianhydride as an acid anhydride were then added little by little in the form of powder. A reaction was then conducted for 1 hour while chilling with ice water and subsequently for 4 hours at 30° C., thereby synthesizing a polyamic acid.

To 588 parts by weight (100 parts by weight in terms of solid content) of the polyamic acid thus obtained, were added 2 parts by weight of 3,3,4,4-tetra (t-butyl peroxycarbonyl)benzophenone (hereinafter referred to as "BTTB"; $\lambda_{max}$=340 nm; product of Nippon Oil & Fat Co., Ltd.), 2 parts by weight of N-phenylglycine and 32 parts by weight of Biscoat (pentaerythritol triacrylate; product of Osaka Organic Chemical Ind. Co., Ltd.) as a photosensitive auxiliary at room temperature into a solution. The thus-obtained composition was coated on a silicon wafer by a spin coater and dried at 70° C. for 4 minutes on a hot plate to form a film having a thickness of about 10 μm. This silicon wafer on which the film had been formed was exposed by means of a PLA-501F (manufactured by Canon Inc.) using a step tablet mask manufactured by TOPPAN PRINTING CO., LTD. and then subjected to spray development with a 0.6% aqueous solution of trimethylammonium hydroxide (TMAH).

As a result, a pattern was able to be obtained at portions to which energy of exposure of at least 200 mJ/cm² (at 436 nm) was applied. A silicon wafer on which a film had been formed in the same manner as described above was also exposed at energy of exposure of 1,000 mJ/cm² by means of the PLA-501F using a resolution-evaluating mask manufactured by TOPPAN PRINTING CO., LTD. and then subjected to the same development as described above. As a result, even a pattern having lines and spaces at intervals of 30.0 μm was able to be resolved.

EXAMPLE 2

A reactor was charged with 57.6 g (0.288 mol) of 4,4'-diaminodiphenyl ether, 11.02 g (0.024 mol) of tris (methacryloyl)pentaerythritol p-aminobenzoate as an amine for terminal modification and 730.5 g of dimethylacetamide to prepare a uniform solution. While stirring the solution and chilling with ice water, 48.3 g (0.15 mol) of 3,3',4,4'-benzophenonetetracarboxylic acid dianhydride and 32.7 g (0.15 mol) of pyromellitic dianhydride as acid anhydrides were then added little by little. A reaction was then conducted for 1 hour while chilling with ice water and subsequently for 4 hours at 30° C., thereby synthesizing a polyamic acid.

To 588 parts by weight (100 parts by weight in terms of solid content) of the polyamic acid thus obtained, were added 2 parts by weight of BTTB ($\lambda_{max}$=340 nm), 2 parts by weight of N-phenylglycine and 32 parts by weight of Biscoat (pentaerythritol triacrylate; product of Osaka Organic Chemical Ind. Co., Ltd.) as a photosensitive auxiliary at room temperature into a solution. The thus-obtained composition was coated on a silicon wafer by a spin coater and dried at 70° C. for 4 minutes on a hot plate to form a film having a thickness of about 10 μm. This silicon wafer on which the film had been formed was exposed by means of a PLA-501F (manufactured by Canon Inc.) using a step tablet mask manufactured by TOPPAN PRINTING CO., LTD. and then subjected to spray development with a 0.6% aqueous solution of TMAH.

As a result, a pattern was able to be obtained at portions to which energy of exposure of at least 200 mJ/cm² (at 436 nm) was applied. A silicon wafer on which a film had been formed in the same manner as described above was also exposed at energy of exposure of 1,000 mJ/cm² by means of the PLA-501F using a resolution-evaluating mask manufactured by TOPPAN PRINTING CO., LTD. and then subjected to the same development as described above. As a result, even a pattern having lines and spaces at intervals of 30.0 μm was able to be resolved.

EXAMPLE 3

A reactor was charged with 54.7 g (0.274 mol) of 4,4'-diaminodiphenyl ether, 11.02 g (0.024 mol) of tris (methacryloyl)pentaerythritol p-aminobenzoate as an amine for terminal modification, 3.58 g (0.014 mol) of 1,3'-bis (aminopropyl)-1,1,3,3-tetramethyldisiloxane and 733.8 g of dimethylacetamide to prepare a uniform solution. While stirring the solution and chilling with ice water, 48.3 g (0.15 mol) of 3,3',4,4'-benzophenonetetracarboxylic acid dianhydride and 32.7 g (0.15 mol) of pyromellitic dianhydride as acid anhydrides were then added little by little. A reaction was then conducted for 1 hour while chilling with ice water and subsequently for 4 hours at 30° C., thereby synthesizing a polyamic acid.

To 588 parts by weight (100 parts by weight in terms of solid content) of the polyamic acid thus obtained, were added 2 parts by weight of BTTB ($\lambda_{max}$=340 nm), 2 parts by weight of N-phenylglycine, 2 parts by weight of thioxanthone and 32 parts by weight of 3EG-A (triethylene glycol diacrylate; product of Kyoeisha Chemical Co., Ltd.) as a photosensitive auxiliary at room temperature into a solution. The thus-obtained composition was coated on a silicon wafer by a spin coater and dried at 70° C. for 4 minutes on a hot plate to form a film having a thickness of about 10 μm. This silicon wafer on which the film had been formed was exposed by means of a PLA-501F (manufactured by Canon Inc.) using a step tablet mask manufactured by TOPPAN PRINTING CO., LTD. and then subjected to spray development with a 0.6% aqueous solution of TMAH.

As a result, a pattern was able to be obtained at portions to which energy of exposure of at least 200 mJ/cm² (at 436 nm) was applied. A silicon wafer on which a film had been formed in the same manner as described above was also exposed at energy of exposure of 1,000 mJ/cm² by means of the PLA-501F using a resolution-evaluating mask manufactured by TOPPAN PRINTING CO., LTD. and then subjected to the same development as described above. As a result, even a pattern having lines and spaces at intervals of 28.8 μm was able to be resolved.

EXAMPLE 4

To 588 parts by weight (100 parts by weight in terms of solid content) of the polyamic acid obtained in Example 3, were added 2 parts by weight of BTTB ($\lambda_{max}$=340 nm), 2 parts by weight of N-phenylglycine, 2 parts by weight of 3,3'-carbonylbis(7-diethylaminocoumarin) and 32 parts by weight of 3EG-A as a photosensitive auxiliary at room temperature into a solution.

The thus-obtained composition was coated on a silicon wafer by a spin coater and dried at 70° C. for 4 minutes on a hot plate to form a film having a thickness of about 10 μm. This silicon wafer on which the film had been formed was exposed by means of a PLA-501F (manufactured by Canon Inc.) using a step tablet mask manufactured by TOPPAN PRINTING CO., LTD. and then subjected to spray development with a 0.6% aqueous solution of TMAH.

As a result, a pattern was able to be obtained at portions to which energy of exposure of at least 50 mJ/cm² (at 436 nm) was applied. A silicon wafer on which a film had been formed in the same manner as described above was also exposed at energy of exposure of 600 mJ/cm² by means of the PLA-501F using a resolution-evaluating mask manufactured by TOPPAN PRINTING CO., LTD. and then subjected to the same development as described above. As a result, even a pattern having lines and spaces at intervals of 25.0 μm was able to be resolved.

Comparative Example 1

A polyamic acid was synthesized under the same conditions as in Example 3 except that 2.23 g (0.024 mol) of aniline were used in place of tris(methacryloyl) pentaerythritol p-aminobenzoate as an amine for terminal modification. The crosslinking auxiliary and photopolymerization initiator were further incorporated under the same conditions as in Example 3 to obtain a photosensitive resin composition.

The thus-obtained composition was coated on a silicon wafer by a spin coater and dried at 70° C. for 4 minutes on a hot plate to form a film having a thickness of about 10 µm. This silicon wafer on which the film had been formed was exposed by means of a PLA-501F (manufactured by Canon Inc.) using a step tablet mask manufactured by TOPPAN PRINTING CO., LTD. and then subjected to spray development with a 0.6% aqueous solution of TMAH.

As a result, a pattern was able to be obtained at portions to which energy of exposure of at least 1,200 mJ/cm² (at 436 nm) was applied. A silicon wafer on which a film had been formed in the same manner as described above was also exposed at energy of exposure of 1,200 mJ/cm² by means of the PLA-501F using a resolution-evaluating mask manufactured by TOPPAN PRINTING CO., LTD. and then subjected to the same development as described above. As a result, any pattern on a practicable level was unable to be resolved.

Comparative Example 2

A composition obtained in the same manner as in Example 4 except that 3EG-A as a photosensitive auxiliary was not added was coated on a silicon wafer by a spin coater and dried at 70° C. for 4 minutes on a hot plate to form a film having a thickness of about 10 µm. This silicon wafer on which the film had been formed was exposed and then subjected to spray development in the same manner as in Example 4. As a result, it was found that any pattern cannot be obtained at energy of exposure of 600 mJ/cm² (at 436 nm) due to rapid dissolution of the film.

Comparative Example 3

To 100 parts by weight (in terms of solid content) of the polyamic acid obtained in Comparative Example 1, were added 32 parts by weight of N,N-diethylaminoethyl methacrylate as a crosslinking auxiliary to prepare a uniform solution. With respect to a photopolymerization initiator, the same initiator as that used in Example 3 was used. The thus-obtained composition was coated on a silicon wafer by a spin coater and dried at 70° C. for 4 minutes on a hot plate to form a film having a thickness of about 10 µm. This silicon wafer on which the film had been formed was exposed and then subjected to spray development in the same manner as in Example 3. As a result, it was found that any pattern cannot be obtained at energy of exposure of 1,000 mJ/cm² (at 436 nm) due to rapid swell of the film.

<Evaluation of film properties>

The composition obtained in Example 4 was coated on a glass substrate by a spin coater and dried at 70° C. for 4 minutes. After a half surface of the thus-obtained film of a polyamic acid was exposed, the film was developed to dissolve and remove the unexposed portion. The remaining film portion was separated and polyimidated under heat in a state that it was held by an O-ring to fix it, thereby preparing a polyimide film. Properties of the resultant polyimide film are given below.

Curing temperature: 350° C.
Breaking strength: 120 (Mpa)
Breaking extension: 11%.

Accordingly, this polyimide film has film properties sufficiently fit for practical use.

<Measurement of residual stress>

The photosensitive resin composition obtained in Example 4 was coated on a silicon wafer (crystal orientation: 100) having a thickness of 500 µm by a spin coater and dried at 70° C. for 4 minutes on a hot plate to form a film having a thickness of about 10 µm. This silicon wafer on which the film had been formed was wholly exposed at energy of exposure of 600 mJ/cm² by means of the PLA-501F using the step tablet mask. Thereafter, the film was subjected to a heat treatment at 350° C. for 2 hours in a nitrogen atmosphere to conduct imidation. After the imidation, the warpage occurred on the silicon wafer was measured by means of a tracer type surface-configuration-measuring device P-10 (manufactured by Tencall Co.). On the basis of its measurement value and the thickness of the film after the imidation, a calculation was made in accordance with a calculation program for residual stress stored in P-10, thereby obtaining a residual stress value of the film.

Residual stress value: 35 Mpa.

Accordingly, this polyimide film has residual stress on a practicable level.

We claim:

1. A pattern forming process, comprising the steps of:
    coating a substrate with a photosensitive resin composition comprising:
    (A) a polyamic compound having, at each terminal thereof, at least one actinic ray-sensitive functional group selected from the group consisting of a group $Z^1$ represented by the following formula (1) and a group $Z^2$ represented by the following formula (2):

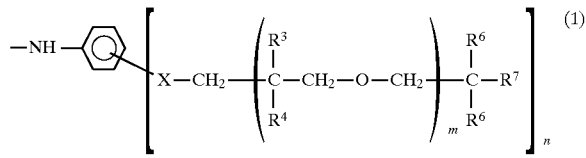

wherein X is a single bond, —O—, —CO—, —COO—, —OCO—, —OCOO—, —COCH$_2$O—, —S—, —SO—, —SO$_2$— or —SO$_2$O—, $R^3$, $R^4$, $R^5$, $R^6$ and $R^7$ are, independently of one another, a substituent group having a photopolymerizable carbon-carbon double bond, m is 0 or 1, and n is an integer of 1–3;

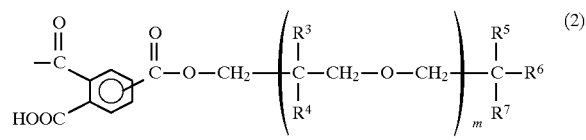

wherein $R^3$, $R^4$, $R^5$, $R^6$ and $R^7$ are, independently of one another, a substituent group having a photopolymerizable carbon-carbon double bond, and m is 0 or 1;
    (B) a photosensitive auxiliary having a photopolymerizable functional group;
    (C) a photopolymerization initiator; and
    (D) a solvent,
    to form a film;
        subjecting the film to pattering exposure; and then
        developing the thus-exposed film with an alkaline developer or alkaline aqueous solution.

2. The pattern forming process according to claim 1, wherein $R^3$, $R^4$, $R^5$, $R^6$ and $R^7$ are, independently of one another, an acryloyloxymethylene group, a methacryloyloxymethylene group, an alkenyl group having 2–6 carbon atoms or an alkenyl group having 2–6 carbon atoms substituted by a substituent selected from the group consisting of halogen atoms, a phenyl group, alkyl groups having 1–4 carbon atoms and alkoxy groups having 1–4 carbon atoms.

3. The pattern forming process according to claim 1, wherein the polyamic acid (A) is a polyamic compound (A1) which has, at each terminal thereof, the actinic ray-sensitive functional group $Z^1$ represented by the formula (1) and is represented by the following formula (3):

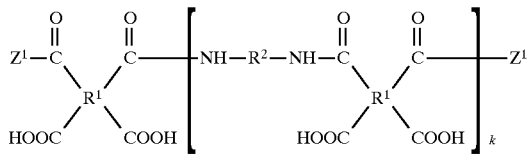

(3)

wherein $R^1$ is a tetravalent organic group, $R^2$ is a bivalent organic group, k is an integer of 5–10,000, and $Z^1$ is the actinic ray-sensitive functional group represented by the formula (1).

4. The pattern forming process according to claim 3, wherein $R^1$ is a tetravalent organic group derived from at least one tetracarboxylic acid or the acid dianhydride thereof selected from the group consisting of aromatic tetracarboxylic acid dianhydrides and hydrogenated products thereof, alicyclic acid dianhydrides, and heterocyclic derivative acid dianhydrides.

5. The pattern forming process according to claim 4, wherein the tetracarboxylic acid or the acid dianhydride is at least one selected from the group consisting of pyromellitic dianhydride and 3,3',4,4'-benzophenonetetracarboxylic acid dianhydride.

6. The pattern forming process according to claim 3, wherein $R^2$ is a bivalent organic group derived from at least one diamine compound selected from the group consisting of aromatic diamines, heterocyclic diamines, alicyclic diamines and aliphatic diamines.

7. The pattern forming process according to claim 6, wherein the diamine compound is at least one selected from the group consisting of 4,4'-diaminodiphenyl ether and 1,4-bis(4-aminophenoxy)benzene.

8. The pattern forming process according to claim 3, wherein the polyamic compound (A1) is synthesized by causing an aminobenzene derivative represented by the following formula (5) to exist upon the synthesis of a polyamic compound by the condensation reaction of a diamine compound with a tetracarboxylic acid or the anhydride thereof:

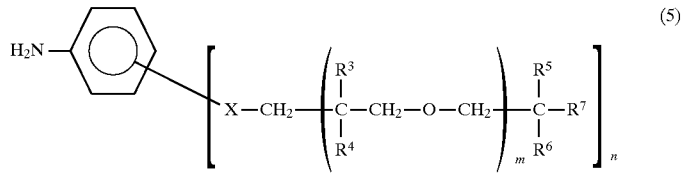

(5)

wherein X is a single bond, —O—, —CO—, —COO—, —OCO—, —OCOO—, —COCH$_2$O—, —S—, —SO—, —SO$_2$— or —SO$_2$O—, $R^3$, $R^4$, $R^5$, $R^6$ and $R^7$ are, independently of one another, a substituent group having a photopolymerizable carbon-carbon double bond, m is 0 or 1, and n is an integer of 1–3.

9. The pattern forming process according to claim 8, wherein the aminobenzene derivative is an aminobenzenecarboxylic ester represented by the following formula (6):

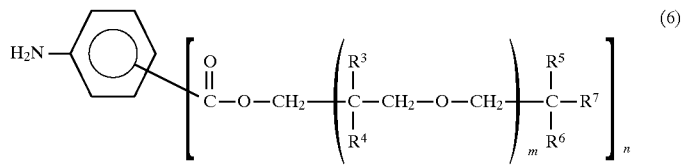

(6)

wherein $R^3$, $R^4$, $R^5$, $R^6$ and $R^7$ are, independently of one another, a substituent group having a photopolymerizable carbon-carbon double bond, m is 0 or 1, and n is an integer of 1–3.

10. The pattern forming process according to claim 8, wherein the aminobenzenecarboxylic ester is tris(methacryloyl)pentaerythritol o-aminobenzoate, tris(acryloyl)pentaerythritol o-aminobenzoate, tris(methacryloyl)pentaerythritol m-aminobenzoate, tris(acryloyl)pentaerythritol m-aminobenzoate, tris(methacryloyl)pentaerythritol p-aminobenzoate, tris(acryloyl)pentaerythritol p-aminobenzoate, tris(methacryloyl)pentaerythritol di-5-aminoisophthalate, tris(acryloyl)pentaerythritol di-5-aminoisophthalae, pentakis(methacryloyl)dipentaerythritol o-aminobenzoate, pentakis(acryloyl)dipentaerythritol o-aminobenzoate, pentakis(methacryloyl)dipentaerythritol m-aminobenzoate, pentakis(acryloyl)dipentaerythritol m-aminobenzoate, pentakis(methacryloyl)dipentaerythritol p-aminobenzoate. or pentakis(acryloyl)dipentaerythritol p-aminobenzoate.

11. The pattern forming process according to claim 8, wherein the polyamic compound (A1) is synthesized by using the tetracarboxylic acid or the anhydride thereof, the diamine compound and the aminobenzene derivative in the following proportions:

(1) the diamine compound is used in a proportion of 0.850–0.990 moles per mole of the tetracarboxylic acid or the anhydride thereof;

(2) the aminobenzene derivative is used in a proportion of 0.400–0.020 moles per mole of the diamine compound; and (3) the diamine compound and the aminobenzene derivative are used in a proportion of 1.100–0.900 moles in total per mole of the tetracarboxylic acid or the anhydride thereof.

12. The pattern forming process according to claim 1, wherein the polyamic acid (A) is a polyamic compound (A2)

which has, at each terminal thereof, the actinic ray-sensitive functional group $Z^2$ represented by the formula (2) and is represented by the following formula (4):

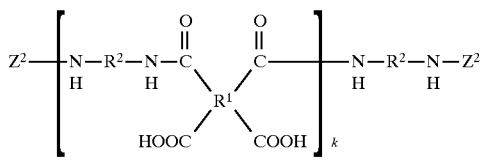

wherein $R^1$ is a tetravalent organic group, $R^2$ is a bivalent organic group, k is an integer of 5–10,000, and $Z^2$ is the actinic ray-sensitive functional group represented by the formula (2).

13. The pattern forming process according to claim 12, wherein $R^1$ is a tetravalent organic group derived from at least one tetracarboxylic acid or the acid dianhydride thereof selected from the group consisting of aromatic tetracarboxylic acid dianhydrides and hydrogenated products thereof, alicyclic acid dianhydrides, and heterocyclic derivative acid dianhydrides.

14. The pattern forming process according to claim 13, wherein the tetracarboxylic acid or the acid dianhydride is at least one selected from the group consisting of pyromellitic dianhydride and 3,3',4,4'-benzophenonetetracarboxylic acid dianhydride.

15. The pattern forming process according to claim 12, wherein $R^2$ is a bivalent organic group derived from at least one diamine compound selected from the group consisting of aromatic diamines, heterocyclic diamines, alicyclic diamines and aliphatic diamines.

16. The pattern forming process according to claim 15, wherein the diamine compound is at least one selected from the group consisting of 4,4'-diaminodiphenyl ether and 1,4-bis(4-aminophenoxy)benzene.

17. The pattern forming process according to claim 12, wherein the polyamic compound (A2) is synthesized by causing a trimellitic acid derivative represented by the following formula (10) to exist upon the synthesis of a polyamic compound by the condensation reaction of a diamine compound with a tetracarboxylic acid or the anhydride thereof:

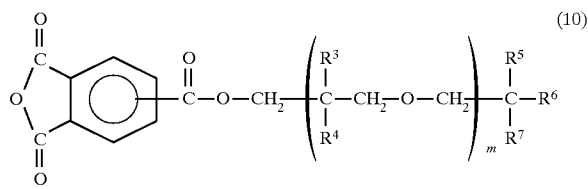

wherein $R^3$, $R^4$, $R^5$, $R^6$ and $R^7$ are, independently of one another, a substituent group having a photopolymerizable carbon-carbon double bond, and m is 0 or 1.

18. The pattern forming process according to claim 17, wherein the trimellitic acid derivative is at least one selected from the group consisting of tris(acryloyl)pentaerythritol anhydrotrimellitate and tris(methacryloyl)pentaerythritol anhydrotrimellitate.

19. The pattern forming process according to claim 17, wherein the polyamic compound (A2) is synthesized by using the diamine compound, the tetracarboxylic acid or the anhydride thereof, and the trimellitic acid derivative in the following proportions:

(1) the tetracarboxylic acid or the anhydride thereof is used in a proportion of 0.850–0.990 moles per mole of the diamine compound;

(2) the trimellitic acid derivative is used in a proportion of 0.400–0.020 moles per mole of the tetracarboxylic acid or the anhydride thereof; and (3) the tetracarboxylic acid or the anhydride thereof and the trimellitic acid derivative are used in a proportion of 1.100–0.900 moles in total per mole of the diamine compound.

20. The pattern forming process according to claim 1, wherein the photosensitive auxiliary (B) having a photopolymerizable functional group is an acrylic or methacrylic compound.

21. The pattern forming process according to claim 20, wherein the acrylic compound is an acrylic compound selected from the group consisting of acrylic acid, methyl acrylate, ethyl acrylate, n-propyl acrylate, isopropyl acrylate, n-butyl acrylate, isobutyl acrylate, cyclohexyl acrylate, benzyl acrylate, carbitol acrylate, methoxyethyl acrylate, ethoxyethyl acrylate, butoxyethyl acrylate, hydroxyethyl acrylate, hydroxypropyl acrylate, butylene glycol monoacrylate, N,N-dimethylaminoethyl acrylate, N,N-diethylaminoethyl acrylate, glycidyl acrylate, tetrahydrofurfuryl acrylate, pentaerythritol monoacrylate, trimethylolpropane monoacrylate, allyl acrylate, 1,3-propylene glycol diacrylate, 1,4-butylene glycol diacrylate, 1,6-hexane glycol diacrylate, neopentyl glycol diacrylate, dipropylene glycol diacrylate, 2,2-bis(4-acryloxydiethoxyphenyl) propane, 2,2-bis(4-acryloxypropyloxyphenyl)propane, trimethylolpropane diacrylate, pentaerythritol diacrylate, trimethylolpropane triacrylate, pentaerythritol triacrylate, triacrylformal, tetramethylolmethane tetraacrylate, tris(2-hydroxyethyl) isocyanuric acid acrylate, compounds represented by the following formula (16):

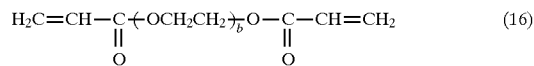

wherein b means an integer of 1–30, compounds represented by the following formula (17):

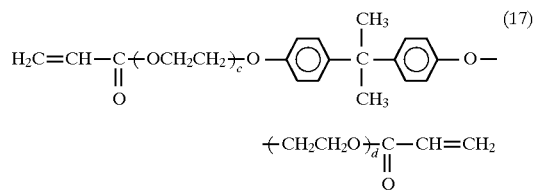

wherein c and d denote integers satisfying c+d=2–30, a compound represented by the following formula (18):

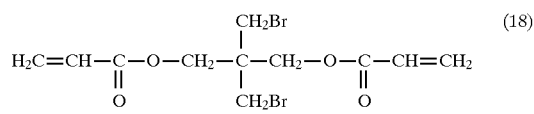

and a compound represented by the following formula (19):

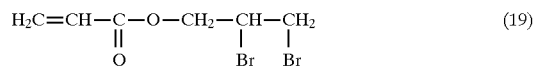

22. The pattern forming process according to claim 20, wherein the methacrylic compound is a methacrylic compound selected from the group consisting of methacrylic acid, methyl methacrylate, ethyl methacrylate, propyl methacrylate, isopropyl methacrylate, butyl methacrylate, isobutyl methacrylate, cyclohexyl methacrylate, benzyl methacrylate, octyl methacrylate, ethylhexyl methacrylate, methoxyethyl methacrylate, ethoxyethyl methacrylate, butoxyethyl methacrylate, hydroxyethyl methacrylate, hydroxypropyl methacrylate, hydroxybutyl methacrylate, hydroxypentyl methacrylate, N,N-dimethylaminoethyl methacrylate, N,N-diethylaminoethyl methacrylate, glycidyl methacrylate, tetrahydrofurfuryl methacrylate, methacryloxypropyltrimethoxysilane, allyl methacrylate, trimethylolpropane monomethacrylate, pentaerythritol monomethacrylate, 1,3-butylene glycol dimethacrylate, 1,6-hexane glycol dimethacrylate, neopentyl glycol dimethacrylate, 2,2-bis(4-methacryloxydiethoxyphenyl) propane, trimethylolpropane dimethacrylate, pentaerythritol dimethacrylate, trimethylolpropane trimethacrylate, pentaerythritol trimethacrylate, tetramethylolmethane tetramethacrylate, tris(2-hydroxyethyl) isocyanuric acid methacrylate, compounds represented by the following formula (20):

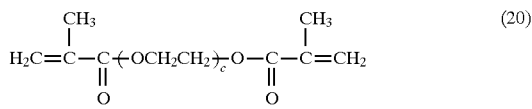

wherein e means an integer of 1–30, compounds represented by the following formula (21):

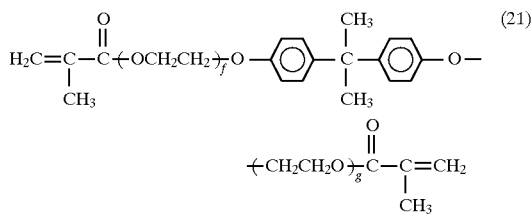

wherein f and g denote integers satisfying f+g=1–30, a compound represented by the following formula (22):

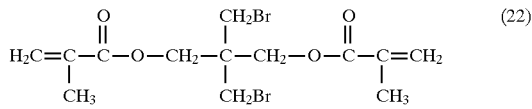

and a compound represented by the following formula (23):

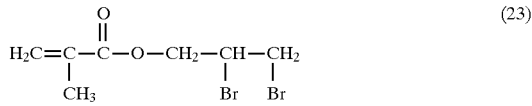

23. The pattern forming process according to claim 21, wherein the acrylic compound is at least one acrylic compound selected from the group consisting of pentaerthritol triacrylate and the compounds (b=2 or 3) represented by the formula (16).

24. The pattern forming process according to claim 1, wherein the photopolymerization initiator (C) is at least one compound selected from the group consisting of Michler's ketone, benzoin, 2-methylbenzoin, benzoin methyl ether, benzoin ethyl ether, benzoin isopropyl ether, benzoin butyl ether, 2-t-butylanthraquinone, 1,2-benzo-9,10-anthraquinone, anthraquinone, methylanthraquinone, 4,4'-bis(diethylamino)benzophenone, acetophenone, benzophenone, thioxanthone, 1,5-acenaphthene, 2,2-dimethoxy-2-phenylacetophenone, 1-hydroxycyclohexyl phenyl ketone, 2-methyl-[4-(methylthio)phenyl]-2-morpholino-1-propanone, diacetylbenzyl, benzyldimethyl ketal, benzyldiethyl ketal, diphenyl disulfide, anthracene, phenanthrenequinone, riboflavin tetrabutyrate, acrylorange, erythrosine, phenanthrenequinone, 2-isopropylthioxanthone, 2,6-bis(p-diethylaminobenzylidene-4-methyl-4-azacyclohexanone, 6-bis(p-dimethylaminobenzylidene)cyclopentanone, 2,6-bis(p-diethylaminobenzylidene-4-phenylcyclohexanone, aminostyryl ketone represented by the following formula (24):

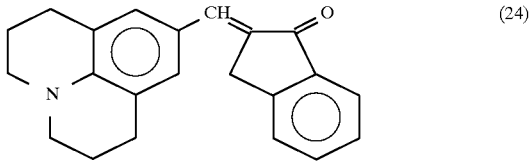

3-ketocoumarin compounds represented by the following formula (25):

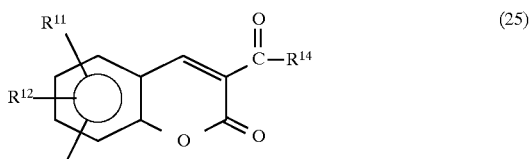

wherein $R^{14}$ is an aromatic carbon ring or heterocycle having 5–20 ring-forming atoms, and $R^{11}$, $R^{12}$ and $R^{13}$ are, independently of one another, a hydrogen atom, a hydroxyl group, or an alkyl, dialkylamino, alkoxy or acyloxy group having 1–5 carbon atoms, biscoumarin compounds represented by the following formula (26):

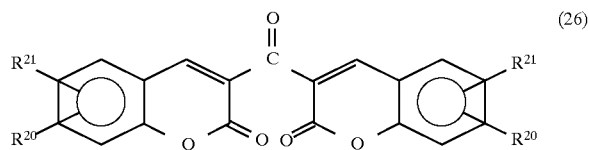

wherein $R^{20}$ and $R^{21}$ are, independently of each other, a hydrogen atom, or an alkyl, dialkylamino, alkoxy or acyloxy group having 1–5 carbon atoms, N-phenylglycine, N-phenyldiethanolamine and 3,3',4,4'-tetra(t-butyl peroxycarbonyl)benzophenone.

25. The pattern forming process according to claim 1, wherein the photosensitive resin composition comprises the photosensitive auxiliary (B) having a photopolymerizable functional group in a proportion of 10–50 parts by weight per 100 parts by weight of the polyamic compound (A), the photopolymerization initiator (C) in a proportion of 0.1–10 parts by weight per 100 parts by weight of the polyamic compound (A) and the solvent (D) in a proportion sufficient to uniformly dissolve the individual components.

26. The pattern forming process according to claim 1, wherein the photosensitive resin composition further comprises 1H-tetrazole, 5,5'-bis-1H-tetrazole or a derivative thereof.

27. The pattern forming process according to claim 1, wherein the alkaline developer or alkaline aqueous solution is composed of 100 parts by weight of an organic solvent, water or a mixture thereof, and 0.001–50 parts by weight of a basic compound.

28. The pattern forming process according to claim 1, wherein the polyamic compound (A) is such that a film 20 μm thick formed therefrom is completely dissolved within 5 minutes in a 10% aqueous solution of trimethylammonium halide in a state of paddle dipping at 25° C.

* * * * *

UNITED STATES PATENT AND TRADEMARK OFFICE
CERTIFICATE OF CORRECTION

PATENT NO. : 5,886,136
DATED : March 23, 1999
INVENTOR(S) : Akira Tanaka et al

It is certified that error appears in the above-identified patent and that said Letters Patent is hereby corrected as shown below:

Claim 1, column 26, formula (1) appearing at lines 36-42, change

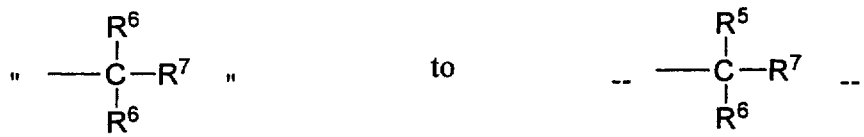

Claim 1, column 26, line 65, change "pattering" to --patterning--.

Claim 22, column 31, formula (20) appearing at lines 13-17, change the subscript "*c*" to --*e*--.

Signed and Sealed this

Thirty-first Day of August, 1999

Attest:

Q. TODD DICKINSON

*Attesting Officer*  *Acting Commissioner of Patents and Trademarks*